US009966334B2

United States Patent
Sawada

(10) Patent No.: US 9,966,334 B2
(45) Date of Patent: May 8, 2018

(54) SEMICONDUCTOR MODULE

(71) Applicant: Sumitomo Electric Industries, Ltd., Osaka-shi (JP)

(72) Inventor: Kenichi Sawada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days. days.

(21) Appl. No.: 15/511,090

(22) PCT Filed: Sep. 2, 2015

(86) PCT No.: PCT/JP2015/074945
§ 371 (c)(1),
(2) Date: Mar. 14, 2017

(87) PCT Pub. No.: WO2016/059901
PCT Pub. Date: Apr. 21, 2016

(65) Prior Publication Data
US 2017/0287828 A1    Oct. 5, 2017

(30) Foreign Application Priority Data
Oct. 15, 2014 (JP) .................................. 2014-211110

(51) Int. Cl.
*H01L 23/495* (2006.01)
*H01L 23/498* (2006.01)
(Continued)

(52) U.S. Cl.
CPC ...... *H01L 23/49844* (2013.01); *H01L 25/072* (2013.01); *H01L 25/18* (2013.01)

(58) Field of Classification Search
CPC ............. H01L 21/4825; H01L 23/3114; H01L 23/4952; H01L 23/49503; H01L 23/49275;
(Continued)

(56) References Cited

U.S. PATENT DOCUMENTS

2001/0015478 A1* 8/2001 Tsunoda ................ H02M 7/003
257/672
2014/0027891 A1* 1/2014 Kimura ............... H01L 23/3107
257/675
2014/0097501 A1    4/2014 Guo et al.

FOREIGN PATENT DOCUMENTS

JP    S52-106564 U    1/1977
JP    S55-137503       3/1979
(Continued)

OTHER PUBLICATIONS

International Search Report in counterpart International Application No. PCT/JP2015/074945, dated Nov. 17, 2015.

*Primary Examiner* — Brook Kebede
(74) *Attorney, Agent, or Firm* — Venable LLP; Michael A. Sartori; Laura G. Remus

(57) ABSTRACT

A semiconductor module (10A) according to one embodiment includes: vertical first and second transistor chips (12A, 12B), wherein a second main electrode pad (20) formed on a back surface of the first transistor chip is mounted on and connected to a first wiring pattern (74) on the substrate, a first control electrode pad (16) formed together with a first main electrode pad on a front surface of the first transistor chip is electrically connected to a second wiring pattern (76) on the substrate, third main electrode pad (18) formed together with a second control electrode pad on a front surface of the second transistor is mounted on and connected to the first wiring pattern, and the second control electrode pad (16) formed on a back surface of the second transistor chip is electrically connected to a third wiring pattern.

14 Claims, 20 Drawing Sheets

(51) Int. Cl.
*H01L 25/07* (2006.01)
*H01L 25/18* (2006.01)

(58) Field of Classification Search
CPC ............... H01L 23/49844; H01L 25/18; H01L 25/0652; H01L 25/072
USPC ......................... 257/379, 372, 668, 672, 675
See application file for complete search history.

(56) References Cited

FOREIGN PATENT DOCUMENTS

| | | |
|---|---|---|
| JP | 2000-049281 A | 2/2000 |
| JP | 2005-011986 A | 1/2005 |
| JP | 2010-245212 A | 10/2010 |
| JP | 4993824 B2 | 8/2012 |
| JP | 2013-089948 A | 5/2013 |
| JP | 2013-171870 A | 9/2013 |
| JP | 2013-172961 A | 9/2013 |
| JP | 2013-179261 A | 9/2013 |
| WO | 2011/095309 A2 | 8/2011 |
| WO | 2013/115395 A1 | 8/2013 |

* cited by examiner

SEMICONDUCTOR MODULE

TECHNICAL FIELD

The present invention relates to a semiconductor module.

BACKGROUND ART

As a semiconductor module, a power converter such as an inverter has been known (see Patent Literature 1). In the first semiconductor module used for the power converter, a transistor chip as an upper arm switch in the inverter and a transistor chip as a lower arm switch are mounted to be connected together in series on a substrate. The transistor chip includes a vertical transistor chip having a gate electrode pad (control electrode pad) and a source electrode pad (first main electrode pad) on a front surface and having a drain electrode pad (second main electrode pad) on a back surface (for example, Patent Literature 2).

CITATION LIST

Patent Literature

Patent Literature 1: Japanese Unexamined Patent Publication No. 2013-171870
Patent Literature 2: Japanese Patent No. 4993824

SUMMARY OF INVENTION

Technical Problem

When two vertical transistor chips connected together in series are mounted on the substrate in the semiconductor module used for the power converter such as the inverter, usually, the transistor chips are mounted on the substrate so that the drain electrode pads of the two vertical transistors face the substrate. In this case, in order to connect the two vertical transistor chips together in series, the drain electrode pad of the vertical transistor chip of a lower arm and the source electrode pad of the vertical transistor chip of an upper arm have to be connected together via a conducting wire such as a wire. That is, in the series connection of the two vertical transistors, the conducting wire such as the wire is interposed.

A gate voltage supplied to the transistor chip of the upper arm is set on the basis of, for example, a potential of the source electrode pad of the transistor chip of the upper arm. However, when the drain electrode pad of the vertical transistor chip of the lower arm and the source electrode pad of the vertical transistor chip of the upper arm are connected together via the conducting wire such as the wire as described above, fluctuation occurs in a source potential due to an inductance component of the conducting wire, and, as a result, fluctuation occurs in the gate voltage (potential) when the semiconductor module is driven. The fluctuation of the source potential and the fluctuation of the gate voltage associated therewith are prominent as a driving frequency of the semiconductor module is increased. For that reason, when the semiconductor module is driven not to cause the fluctuation, the operation rate of the semiconductor module may be limited.

Here, as the transistor chip, mainly a vertical metal-oxide-semiconductor field-effect transistor (MOSFET) has been described having the gate electrode pad (control electrode pad) and the source electrode pad (first main electrode pad) and having the drain electrode pad (second main electrode pad) on the back surface; however, a similar problem can occur in the other vertical transistors.

Therefore, an object of the present invention is to provide a semiconductor module capable of being driven at a higher frequency.

Solution to Problem

A semiconductor module according to an aspect of the present invention includes: a substrate on which a first wiring pattern, a second wiring pattern, and a third wiring pattern are formed on a principal surface; a vertical first transistor chip mounted on the substrate; and a vertical second transistor chip mounted on the substrate. The first transistor chip has a first main electrode pad and a second main electrode pad, and a first control electrode pad to which a control voltage is supplied for controlling conduction between the first main electrode pad and the second main electrode pad. The first main electrode pad and the first control electrode pad are formed on a front surface of the first transistor chip, and the second main electrode pad is formed on a back surface of the first transistor chip. The second transistor chip has a third main electrode pad and a fourth main electrode pad, and a second control electrode pad to which a control voltage is supplied for controlling conduction between the third main electrode pad and the fourth main electrode pad. The third main electrode pad and the second control electrode pad are formed on a front surface of the second transistor chip, and the fourth main electrode pad is formed on a back surface of the second transistor chip. The first transistor chip is mounted on the first wiring pattern such that the back surface of the first transistor chip faces the principal surface of the substrate, thereby connecting the second main electrode pad to the first wiring pattern. The first control electrode pad is electrically connected to the second wiring pattern. The second transistor chip is mounted on the first wiring pattern such that the front surface of the second transistor chip faces the principal surface of the substrate, thereby connecting the third main electrode pad to the first wiring pattern. The second control electrode pad of the second transistor chip is electrically connected to the third wiring pattern.

Advantageous Effects of Invention

According to the present invention, a semiconductor module can be provided capable of operating at a higher frequency.

DESCRIPTION OF EMBODIMENTS

Figure 1:
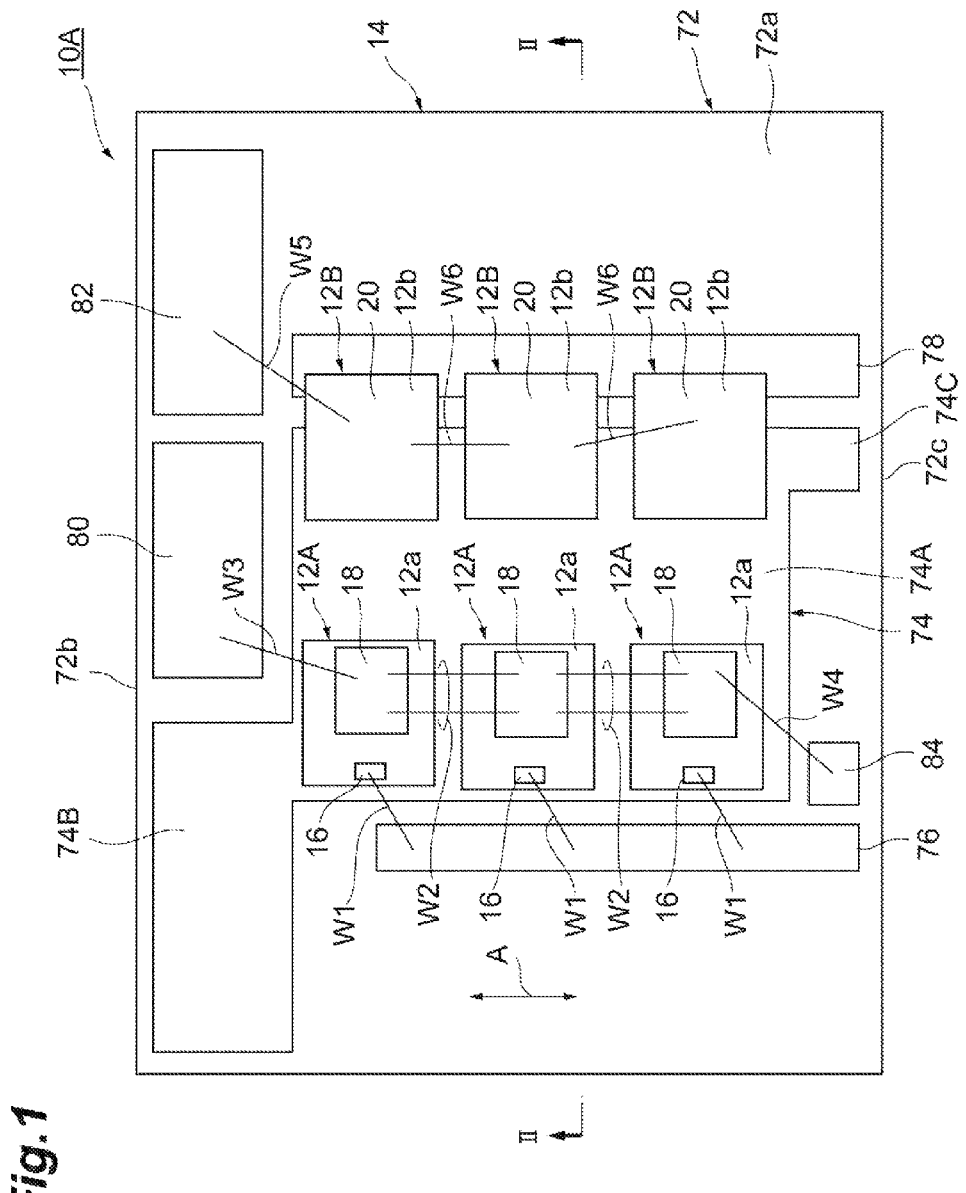
FIG. 1 is a schematic plan view of a semiconductor module according to a first embodiment.

Hereinafter, embodiments of the present invention will be described with reference to the drawings. In the description of the drawings, the same elements will be denoted by the same reference signs, without redundant description. The dimensional ratios in the drawings are not always coincident with those in the description.

Description of Embodiments of the Present Invention

First, details of the embodiments of the present invention are listed and described.

(1) A semiconductor module according to one embodiment includes: a substrate on which a first wiring pattern, a second wiring pattern, and a third wiring pattern are formed on a principal surface; a vertical first transistor chip mounted on the substrate; and a vertical second transistor chip mounted on the substrate. The first transistor chip has a first main electrode pad and a second main electrode pad, and a first control electrode pad to which a control voltage is supplied for controlling conduction between the first main electrode pad and the second main electrode pad. The first main electrode pad and the first control electrode pad are formed on a front surface of the first transistor chip, and the second main electrode pad is formed on a back surface of the first transistor chip. The second transistor chip has a third main electrode pad and a fourth main electrode pad, and a second control electrode pad to which a control voltage is supplied for controlling conduction between the third main electrode pad and the fourth main electrode pad. The third main electrode pad and the second control electrode pad are formed on a front surface of the second transistor chip, and the fourth main electrode pad is formed on a back surface of the second transistor chip. The first transistor chip is mounted on the first wiring pattern such that the back surface of the first transistor chip faces the principal surface of the substrate, thereby connecting the second main electrode pad to the first wiring pattern. The first control electrode pad is electrically connected to the second wiring pattern. The second transistor chip is mounted on the first wiring pattern such that the front surface of the second transistor chip faces the principal surface of the substrate, thereby connecting the third main electrode pad to the first wiring pattern. The second control electrode pad of the second transistor chip is electrically connected to the third wiring pattern.

In the semiconductor module described above, the first transistor chip is mounted on the substrate so that the back surface of the transistor chip faces the substrate, and the second main electrode pad is connected to the first wiring pattern. The first control electrode pad of the first transistor chip is electrically connected to the second wiring pattern. The second transistor chip is mounted on the substrate so that the front surface of the second transistor chip faces the substrate, and the third main electrode pad is connected to the first wiring pattern. The second control electrode pad of the second transistor chip is electrically connected to the third wiring pattern.

Since the second main electrode pad of the first transistor chip and the first main electrode pad of the second transistor chip are both mounted on the first wiring pattern in this way, the first and second transistor chips are connected together in series via the first wiring pattern. Therefore, when the control voltage is supplied to each of the first and second control electrode pads of the first and second transistor chips via the second and third wiring patterns, a negative voltage is supplied to the first main electrode pad of the first transistor chip, and a positive voltage is supplied to the fourth main electrode pad of the second transistor chip, for example, an inverter circuit can be achieved Fin which the second transistor chip is an upper arm and the first transistor chip is a lower arm.

When the semiconductor module is used as the inverter, the control voltage supplied to the second control electrode pad of the second transistor chip corresponding to the upper arm can be determined on the basis of a potential of the first main electrode pad of the second transistor chip. In the configuration described above, the first and second transistor chips are connected together in series via the first wiring pattern. For that reason, for example, a conducting wire is not necessary for wiring the first and second transistor chip together in series. Therefore, potential fluctuation in the third main electrode pad of the second transistor chip due to the inductance component of the conducting wire is suppressed. As a result, fluctuation of the control voltage supplied to the second control electrode pad of the second transistor chip is also suppressed.

As a frequency is increased of the control voltage for driving the semiconductor module, influence of the inductance component of the conducting wire increases. However, because the potential fluctuation in the third main electrode pad of the second transistor chip due to the inductance component of the conducting wire is suppressed in the semiconductor module, the semiconductor module can be driven at a higher frequency.

(2) In one embodiment, the semiconductor module may be configured such that the first transistor chip is multiply provided, the second transistor chip is multiply provided, each one of the first transistor chips and the second transistor chips includes a wide band gap semiconductor, the first main electrode pads of the plurality of first transistor chips are connected together via a conducting wire, and the fourth main electrode pads of the plurality of second transistor chips are connected together via a conducting wire.

Each of the plurality of first transistor chips is mounted on the substrate as described above, and the first main electrode pads of the plurality of first transistor chips are connected together via the conducting wire. Thus, the plurality of first transistor chips is electrically connected together in parallel. Similarly, each of the plurality of second transistor chips is mounted on the substrate as described above, and the fourth main electrode pads of the plurality of second transistor chips are connected together via the conducting wire. Thus, the plurality of second transistor chips is electrically connected together in parallel. A transistor chip using a wide band gap semiconductor tends to be smaller than a transistor chip using silicon. As described above, the plurality of first transistor chips is connected together in parallel, and the plurality of second transistor chips is connected together in parallel, so that a larger current is easily allowed to flow through the semiconductor module.

(3) In one embodiment, the first control electrode pad of each of the first transistor chips may be connected to the second wiring pattern via a first resistance part, and the first resistance part may have a plurality of first resistance elements each of which corresponds to each of the plurality of first transistor chips and is connected to the first control electrode pad, and a linking part linking the plurality of first resistance elements together.

In the configuration described above, the first control electrode pad of each of the first transistor chips is connected to the second wiring pattern via the first resistance part. For that reason, because the control voltage is supplied to the first control electrode pad via the corresponding first resistance element in the first resistance part, the fluctuation of the control voltage is suppressed by the first resistance element. The plurality of first resistance elements is integrated together by the linking part, in the first resistance part. For that reason, when each of the plurality of first transistor chips is connected to the second wiring pattern via the corresponding first resistance element, the first control electrode pad of each of the first transistor chips and the corresponding first resistance element are easily connected together, and, as a result, misalignment can be prevented between the first resistance element and the first control electrode pad during the connection.

(4) In one embodiment, each of the first resistance elements and the first control electrode pad may be physically connected together, and each of the first resistance elements and the second wiring pattern may be physically connected together.

In this case, since the conducting wire is not necessary when the first control electrode pad of each of the first transistor chips and the second wiring pattern are connected together via the corresponding first resistance element, the inductance component due to such a conducting wire does not occur. As a result, fluctuation of the control voltage supplied to the first control electrode pad hardly occurs, and the semiconductor module can be driven at a high frequency.

(5) In one embodiment, the first control electrode pad of each of the first transistor chips may be connected to the second wiring pattern via the corresponding first resistance element, each of the first resistance elements and the first control electrode pad may be physically connected together, and each of the first resistance elements and the second wiring pattern may be physically connected together.

In this case, fluctuation of the control voltage supplied to the first control electrode pad can be suppressed by providing each of the first resistance elements. Further, since each of the first resistance elements is physically connected to the first control electrode pad and the second wiring pattern, each of the first resistance elements is directly connected to the first control electrode pad and the second wiring pattern without going through the conducting wire and the like. For that reason, when the first control electrode pad of each of the first transistor chips and the second wiring pattern are connected together via the corresponding first resistance element, the inductance component due to the conducting wire does not occur. As a result, fluctuation of the control voltage supplied to the first control electrode pad is suppressed, and the semiconductor module can be driven at a high frequency.

(6) In one embodiment, the plurality of first transistor chips may be arranged in a predetermined direction on the first wiring pattern, and the first control electrode pad of each of the first transistor chips may extend in the predetermined direction.

In this case, since the plurality of first transistor chips is arranged in the predetermined direction, when the first control electrode pad of each of the first transistor chips is connected to the second wiring pattern via the corresponding first resistance element, the plurality of first resistance elements is also arranged in the predetermined direction for the respective first transistor chips. Since the first control electrode pad of each of the first transistor chips extends in the predetermined direction, when the corresponding first resistance element is connected to the first control electrode pad, misalignment is reduced of the first resistance element to the first control electrode pad.

(7) In the above embodiment in which the first control electrode pad extends in the predetermined direction, each of the first transistor chips may have: a cell portion being a region that has a vertical transistor structure including a first main electrode and a second main electrode electrically connected respectively to the first main electrode pad and the second main electrode pad, and a control electrode electrically connected to the first control electrode pad, and in which a current flows in a conduction state between the first main electrode pad and the second main electrode pad; and a circumferential portion surrounding the cell portion and electrically protecting the cell portion, and at least a part of the first control electrode pad may be provided on the circumferential portion.

In this case, each of the first transistor chips has the cell portion being the region in which the current flows in the conduction state between the first main electrode pad and the second main electrode pad, and the circumferential portion surrounding the cell portion. The circumferential portion is a region electrically protecting the cell portion, and a region not substantially contributing to transistor operation. At least a part of the first control electrode pad is provided on the circumferential portion. For that reason, even when the first control electrode pad extends in the predetermined direction, a larger region of the cell portion can be secured.

(8) In one embodiment, the second control electrode pads of the plurality of second transistor chips may be connected to the third wiring pattern by being mounted on the third wiring pattern.

In this configuration, the second control electrode pad is mounted on the third wiring pattern to connect the second control electrode pad to the third wiring pattern. For that reason, the conducting wire is not necessary for connecting the second control electrode pad and the third wiring pattern together. Therefore, when the control voltage is supplied to the second control electrode pad via the third wiring pattern, fluctuation of the control voltage due to the inductance component of the conducting wire hardly occurs. As a result, the semiconductor module can be driven faster.

(9) In one embodiment, the third wiring pattern has: a plurality of chip corresponding regions that respectively corresponds to the plurality of second transistor chips and is insulated from each other; and an external connection region insulated from each of the chip corresponding regions, the second control electrode pad of each of the plurality of second transistor chips is mounted on the corresponding chip corresponding region, thereby being connected to the chip corresponding region, the plurality of chip corresponding regions is connected to the external connection region via the second resistance part, and the second resistance part has a plurality of second resistance elements respectively corresponding to the plurality of chip corresponding regions and connected to the chip corresponding regions, and a second linking part linking the plurality of second resistance elements together.

In this case, the second control electrode pad of each of the second transistor chips is mounted on the corresponding chip corresponding region, and the second control electrode pad and the chip corresponding region are connected together. For that reason, the conducting wire is not necessary for connecting the second control electrode pad and the chip corresponding region together. Each of the chip corresponding regions and the external connection region are connected together via the second resistance part. For that reason, when the external connection region is connected to, for example, a terminal, and the control voltage is supplied from the terminal, the control voltage is supplied to the second control electrode pad via the second resistance element included in the second resistance part. Thus, fluctuation of the control voltage supplied to the second control electrode pad hardly occurs. In addition, the plurality of second resistance elements is integrated together by the second linking part in the second resistance part. For that reason, when each of the plurality of chip corresponding regions is connected to the external connection region via the corresponding second resistance element, each of the plurality of chip corresponding regions and the external connection region are easily connected to the second resistance element.

Details of Embodiments of the Present Invention

Specific examples of the semiconductor module according to embodiments of the present invention will be described below with reference to the drawings. The present invention is not limited to these exemplifications, and it is intended that all modifications are included indicated by the claims, and within a scope and meaning equivalent to the claims. In the description of the drawings, the same elements will be denoted by the same reference signs, without redundant description. The dimensional ratios in the drawings are not always coincident with those in the description.

<1> First Embodiment

Figure 2:
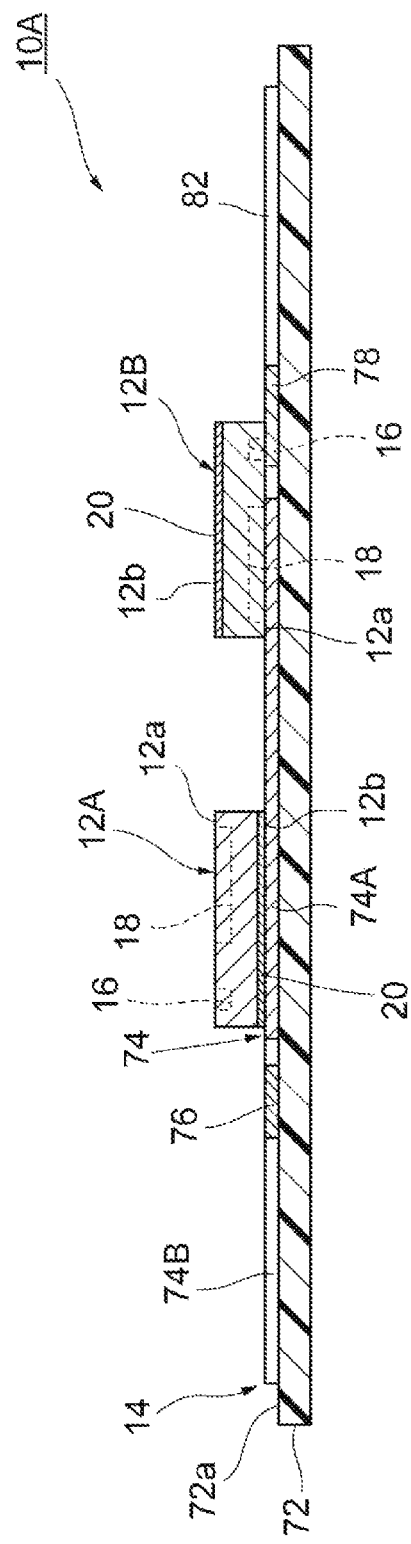
FIG. 2 is a schematic view of a cross section along a line II-II of FIG. 1.

A semiconductor module 10A according to a first embodiment includes a plurality of first transistor chips 12A (three in FIG. 1), a plurality of second transistor chips 12B (three in FIG. 1), and a wiring substrate 14, as illustrated in FIG. 1 and FIG. 2. The semiconductor module 10A is a single phase inverter as a power converter.

The plurality of first transistor chips 12A is electrically connected together in parallel, and configures a first semiconductor switch part as a lower arm in the power converter. The plurality of second transistor chips 12B is electrically connected together in parallel, and configures a second semiconductor switch part as an upper arm. The first and second semiconductor switch parts are connected together in series.

<1.1> First and Second Transistor Chips 12A, 12B

The first and second transistor chips 12A, 12B will be described with reference to FIG. 3, FIG. 4(a), FIG. 4(b), and FIG. 4(c). The configurations of the first and second transistor chips 12A, 12B are the same as each other. For that reason, the configurations of the first and second transistor chips 12A, 12B will be described by referring to each of the first and second transistor chips 12A, 12B as a transistor chip 12.

For description, two directions substantially orthogonal to the thickness direction of the transistor chip 12 (the normal direction of a front surface of a semiconductor substrate 42 described later) are respectively referred to as the x-axis direction and the y-axis direction, as illustrated in FIG. 3, FIG. 4(a), FIG. 4(b), and FIG. 4(c).

Figure 3:
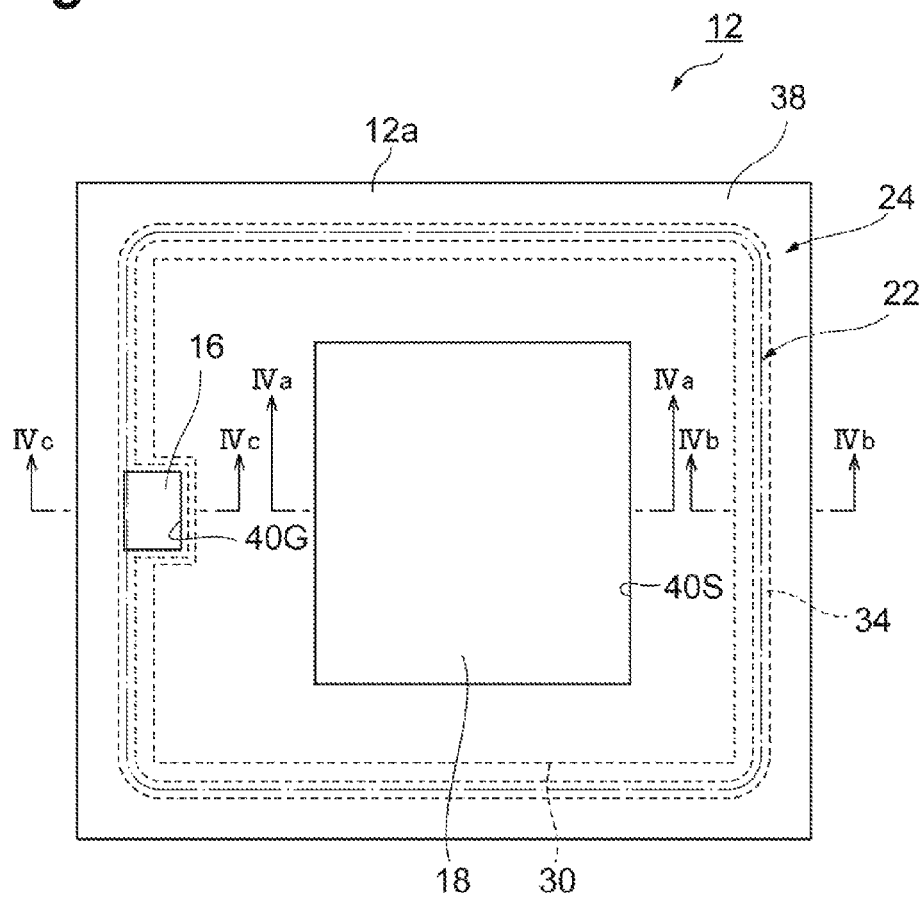
FIG. 3 is a schematic plan view for describing first and second transistors included in the semiconductor module illustrated in FIG. 1.

The transistor chip 12 is a vertical metal-oxide-semiconductor field-effect transistor (MOSFET) in which a gate electrode pad (first control electrode pad) 16 and a source electrode pad (first main electrode pad) 18 are formed on a front surface 12a, as illustrated in FIG. 3, and a drain electrode pad (second main electrode pad) 20 is formed on a back surface 12b, as illustrated in FIG. 4(a) to FIG. 4(c). The gate electrode pad 16 is an electrode pad to which a gate voltage (control voltage) is supplied as a signal (gate signal) for controlling a conduction state between the source electrode pad 18 and the drain electrode pad 20. An example of a semiconductor material of the transistor chip 12 is a wide band gap semiconductor, and an example of the wide band gap semiconductor includes SiC and GaN.

An example of a shape in a plan view of the transistor chip 12 (a shape viewed from the thickness direction of the transistor chip 12) is a substantially quadrilateral shape, as illustrated in FIG. 3. The example of the substantially quadrilateral shape includes a square and a rectangle. In a case in which the shape in a plan view of the transistor chip 12 is a substantially square, the transistor chip 12 has a cell portion 22, and a circumferential portion 24 surrounding the cell portion 22. In FIG. 3, the cell portion 22 is a region surrounded by the one-dot chain line, and the circumferential portion 24 is a portion outside the region surrounded by the one-dot chain line.

A shape in a plan view of the cell portion 22 can be a shape similar to the shape in a plan view of the transistor chip 12. The shape in a plan view of the cell portion 22 will be described as a substantially square in the first embodiment. An example of the length of one side of the cell portion 22 is 20 µm or less.

The cell portion 22 is configured by a plurality of unit cells 26 arranged in parallel, as illustrated in FIG. 4(a). Adjacent unit cells 26 are physically arranged contiguously in parallel. In this embodiment, the cell portion 22 is an active part in which a main current flows in a channel region.

In one embodiment, the cell portion 22 can be configured by the plurality of unit cells 26 whose shape in a plan view is a quadrilateral shape connected together in parallel in an array. In one embodiment, each of the unit cells 26 can have a stripe shape extending in one direction. In this case, the cell portion 22 can have the configuration in which the plurality of unit cells 26 is connected together in parallel in a direction in which each of the unit cells 26 is orthogonal to an extending direction of each of the unit cells 26.

The unit cells 26 each have a vertical transistor structure including a gate electrode (control electrode) 28, a source electrode (first main electrode) 30, and a drain electrode (second main electrode) 32, specifically, a MOSFET structure, and are partitioned on the basis of the gate electrode 28. In the transistor chip 12, the source electrode 30 and the drain electrode 32 are shared by the plurality of unit cells 26.

Specifically, a part of the source electrode 30 provided on the front surface 12a side of the transistor chip 12 functions as the source electrode in each of the unit cells 26, and a part of the drain electrode 32 provided on the back surface 12b side of the transistor chip 12 functions as the drain electrode in each of the unit cells 26. The drain electrode 32 that is common in the plurality of unit cells 26 corresponds to the drain electrode pad 20.

However, the source electrode 30 and the drain electrode 32 may be provided for each of the unit cells 26. In this case, it is sufficient that the source electrode pad 18 is electrically connected to the source electrode 30 for each of the unit cells 26. Similarly, it is sufficient that the drain electrode pad 20 is electrically connected to the drain electrode 32 for each of the unit cells 26.

A gate electrode wiring (control electrode wiring) 34 is provided along the outer edge of the cell portion 22 (the edge illustrated by the one-dot chain line in FIG. 3) in the cell portion 22. That is, the gate electrode wiring (control electrode wiring) 34 is arranged annularly.

The gate electrode wiring 34 is electrically connected to the gate electrode 28 of each of the unit cells 26, and is also referred to as a gate runner. A pad electrode 36 is provided to a part of the gate electrode wiring 34.

A passivation film 38 is formed as a protective film for covering the source electrode 30 and the gate electrode wiring 34, on the front surface 12a of the transistor chip 12. In the transistor chip 12, a gate opening portion 40G and a source opening portion 40S are formed in the passivation film 38 on the pad electrode 36 and the source electrode 30.

A portion of the pad electrode 36 exposed through the gate opening portion 40G is the gate electrode pad 16, as illustrated in FIG. 3, FIG. 4(a), and FIG. 4(c). Similarly, a portion of the source electrode 30 exposed through the source opening portion 40S is the source electrode pad 18.

The configuration of the transistor chip 12 will be described in more details with reference to FIG. 4(a) to FIG. 4(c). First, the configuration common to the cell portion 22 and the circumferential portion 24 will be described. In the following description, a conductivity type of the semiconductor, material, and the like are examples for the description.

The transistor chip 12 has the n-type (first conductivity type) semiconductor substrate 42. An example of a material of the semiconductor substrate 42 is a wide band gap semiconductor. An example of the thickness of the semiconductor substrate 42 is 400 µm.

The drain electrode 32 is provided on the back surface of the semiconductor substrate 42. An example of the drain electrode 32 is a metal film such as a Ni film. An n-type drift layer 44 is provided as an underlying semiconductor layer on the front surface of the semiconductor substrate 42. An example of a material of the drift layer 44 can be the same as the material of the semiconductor substrate 42. An example of the n-type dopant concentration in the drift layer 44 is about $5\times10^{16}$ cm$^{-3}$. An example of the thickness of the drift layer 44 is about 10 µm.

Next, the configurations of the cell portion 22 and the circumferential portion 24 on the semiconductor substrate 42 will be described. First, for the cell portion 22, the configuration of the lower side of the source electrode 30 will be mainly described mainly with reference to FIG. 4(a). The configuration in the vicinity of the outer edge of the cell portion 22 will be described later.

In the surface part of the drift layer 44, a plurality of first p-type (second conductivity type) semiconductor regions 46 is formed apart from each other, as p-body regions. A material of the first p-type semiconductor regions 46 can be the same as the material of the semiconductor substrate 42. An example of the p-type dopant concentration of the first p-type semiconductor regions 46 is about $5\times10^{17}$ cm$^{-3}$. An example of the thickness (or the depth) of the first p-type semiconductor regions 46 is about 1.0 µm.

When the shape in a plan view of each of the unit cells 26 is angular, each of the first p-type semiconductor regions 46 can be formed in an island shape in the surface part of the drift layer 44. When each of the unit cells 26 extends in one direction, each of the first p-type semiconductor regions 46 can also extend in the one direction.

Two n-type source regions 48 are formed apart from each other, in each of the first p-type semiconductor regions 46. An example of the n-type dopant concentration in each of the source regions 48 is about $1\times10^{19}$ cm$^{-3}$. An example of the thickness (or the depth) of each of the source regions 48 is about 0.3 µm.

A gate insulating film 50 and the gate electrode 28 are layered on a region between the adjacent first p-type semiconductor regions 46, 46 in the front surface of the drift layer 44. The gate insulating film 50 and the gate electrode 28 are arranged on the region between the adjacent first p-type semiconductor regions 46, 46 to form a MOS structure with the source regions 48 in each of the first p-type semiconductor regions 46.

The gate insulating film 50 and the gate electrode 28 can be provided for each of the unit cells 26, in the first embodiment. An example of the gate insulating film 50 is a silicon oxide film. An example of the thickness of the gate insulating film 50 is about 50 µm. An example of the gate electrode 28 is a metal film such as an Al film.

A bump part formed of the gate insulating film 50 and the gate electrode 28 is covered with a first interlayer insulating film 52. An example of the first interlayer insulating film 52 is a silicon oxide film.

The source electrode 30 is provided on the first interlayer insulating film 52. An example of the source electrode 30 is a metal film such as a nickel film. An example of the thickness of the source electrode 30 is about 0.1 μm. A first contact region 52a such as a contact hole is formed to the first interlayer insulating film 52 so that each of the source regions 48 and the source electrode 30 are electrically in contact with each other.

In the configuration described above, each of the unit cells 26 has a vertical MOSFET structure and a double diffusion MOSFET structure.

Specifically, when viewed from the gate electrode 28 as a reference, each of the unit cells 26 has the semiconductor substrate 42 and the drain electrode 32 provided on the back surface of the semiconductor substrate 42. Each of the unit cells 26 includes the drift layer 44 provided on the front surface of the semiconductor substrate 42, the first p-type semiconductor regions 46 formed on the surface part of the drift layer 44 and apart from each other, the source regions 48 formed in each of the first p-type semiconductor regions 46, the gate insulating film 50 and the gate electrode 28 forming the MOS structure with the source regions 48, and the source electrode 30 electrically connected to the source regions 48 and insulated from the gate electrode 28

Next, the configuration in the vicinity of the outer edge of the cell portion 22 on which the gate electrode wiring 34 is formed will be described mainly with reference to FIG. 4(b) and FIG. 4(c).

The first p-type semiconductor region 46 as a p-body region is formed along the outer edge of the cell portion 22, in the surface part of the drift layer 44. Hereinafter, for convenience of description, the first p-type semiconductor region 46 formed along the outer edge of the cell portion 22 is also referred to as a second p-type semiconductor region 54.

In one embodiment, the second p-type semiconductor region 54 protrudes from the cell portion 22 toward the circumferential portion 24 side to the outside of the cell portion 22, in order to obtain the breakdown voltage characteristic of the transistor chip 12. In the end portion which is located on the cell portion 22 center side in the second p-type semiconductor region 54, the source region 48 configuring a part of the unit cell 26, and the source region 48, are formed apart from each other.

An insulating film 58, covered by the second interlayer insulating film 56, is provided on the second p-type semiconductor region 54. The materials and thicknesses of the insulating film 58 and the second interlayer insulating film 56 can be the same as those of the gate insulating film 50 and the first interlayer insulating film 52, respectively. The end portion of the cell portion 22 center side of the second interlayer insulating film 56 is covered by a part of the source electrode 30.

In the second interlayer insulating film 56, a second contact region 56a is formed penetrating the second interlayer insulating film 56, in order to electrically connect each of the source regions 48 and the source electrode 30 together in the second p-type semiconductor region 54.

A conductive gate wiring member 60, provided along the outer edge of the cell portion 22, is buried in the second interlayer insulating film 56. The thickness and material of the gate wiring member 60 can be similar to those of the gate electrode 28. The gate wiring member 60 is electrically connected to each gate electrode 28.

The gate electrode wiring 34 is provided on the second interlayer insulating film 56 in a direction in which the gate wiring member 60 extends, that is, along the outer edge of the cell portion 22. A third contact region 56b, penetrating through the second interlayer insulating film 56 to the gate electrode wiring 34, is formed in the second interlayer insulating film 56.

The gate electrode wiring 34 is electrically connected to the gate wiring member 60 via the third contact region 56b. As a result, the gate electrode wiring 34 is electrically connected to the gate electrode 28 of each of the unit cells 26. An example of the gate electrode wiring 34 can be the same as the example of the source electrode 30.

In a part of the gate electrode wiring 34, for example, in a part of a region extending in the y-axis direction of the gate electrode wiring 34 arranged in a substantially quadrilateral shape as illustrated in FIG. 3, the pad electrode 36 is provided, as illustrated in FIG. 4(c). The pad electrode 36 can be formed by forming a part of the gate electrode wiring 34 to have a wide width. In FIG. 4(c), the pad electrode 36 is formed by widening a part of the gate electrode wiring 34 to the cell portion 22 side.

The configuration of the circumferential portion 24 will be described, further with reference to FIG. 4(b) and FIG. 4(c). In the circumferential portion 24, the insulating film 58 and the second interlayer insulating film 56 are layered in order, on the drift layer 44. Here, the circumferential portion 24 includes the insulating film 58 and the second interlayer insulating film 56; however, it is sufficient that the circumferential portion 24 includes the drift layer 44.

The drift layer 44 common to the cell portion 22 is included, so that a depletion layer at a revers bias is more easily widened, and the breakdown voltage characteristic can be obtained. In this case, the circumferential portion 24 functions as a peripheral breakdown resistant part for securing the breakdown voltage characteristic.

In circumferential portion 24, the second p-type semiconductor region 54 can protrude from the cell portion 22 side, as described above. Due to the protruding second p-type semiconductor region 54 in this way, the depletion layer at a reverse bias is easily widened further uniformly. For that reason, the breakdown voltage characteristic in the transistor chip 12 can be secured more. In addition, a trench-shaped third p-type semiconductor region 62 may be provided in the drift layer 44 included in the circumferential portion 24, in order to further secure the breakdown voltage characteristic. The p-type dopant concentration and thickness of the third p-type semiconductor region 62 can be similar to those of the first p-type semiconductor region 46.

The front surface of the layered structure described above formed on the front surface of the semiconductor substrate 42 is covered by the passivation film 38, as illustrated in FIG. 4(a) to FIG. 4(c). The gate opening portion 40G is formed in the passivation film 38 on the pad electrode 36. A portion in which the pad electrode 36 is exposed through the gate opening portion 40G is the gate electrode pad 16.

The source opening portion 40S is formed also in the passivation film 38 on the source electrode 30. A portion in which the source electrode 30 is exposed through the source opening portion 40S is the source electrode pad 18. An example of the passivation film 38 is a SiN film. An example of the thickness of the passivation film 38 is 10 μm.

Next, an example of a method for manufacturing the transistor chip 12 will be described with reference to FIG. 5(a) to FIG. 5(f) and FIG. 6(a) to FIG. 6(e). In FIG. 5(a) to FIG. 5(f) and FIG. 6(a) to FIG. 6(e), a manufacturing process in the vicinity of the configuration illustrated in FIG. 4(c) is illustrated.

Figure 5:
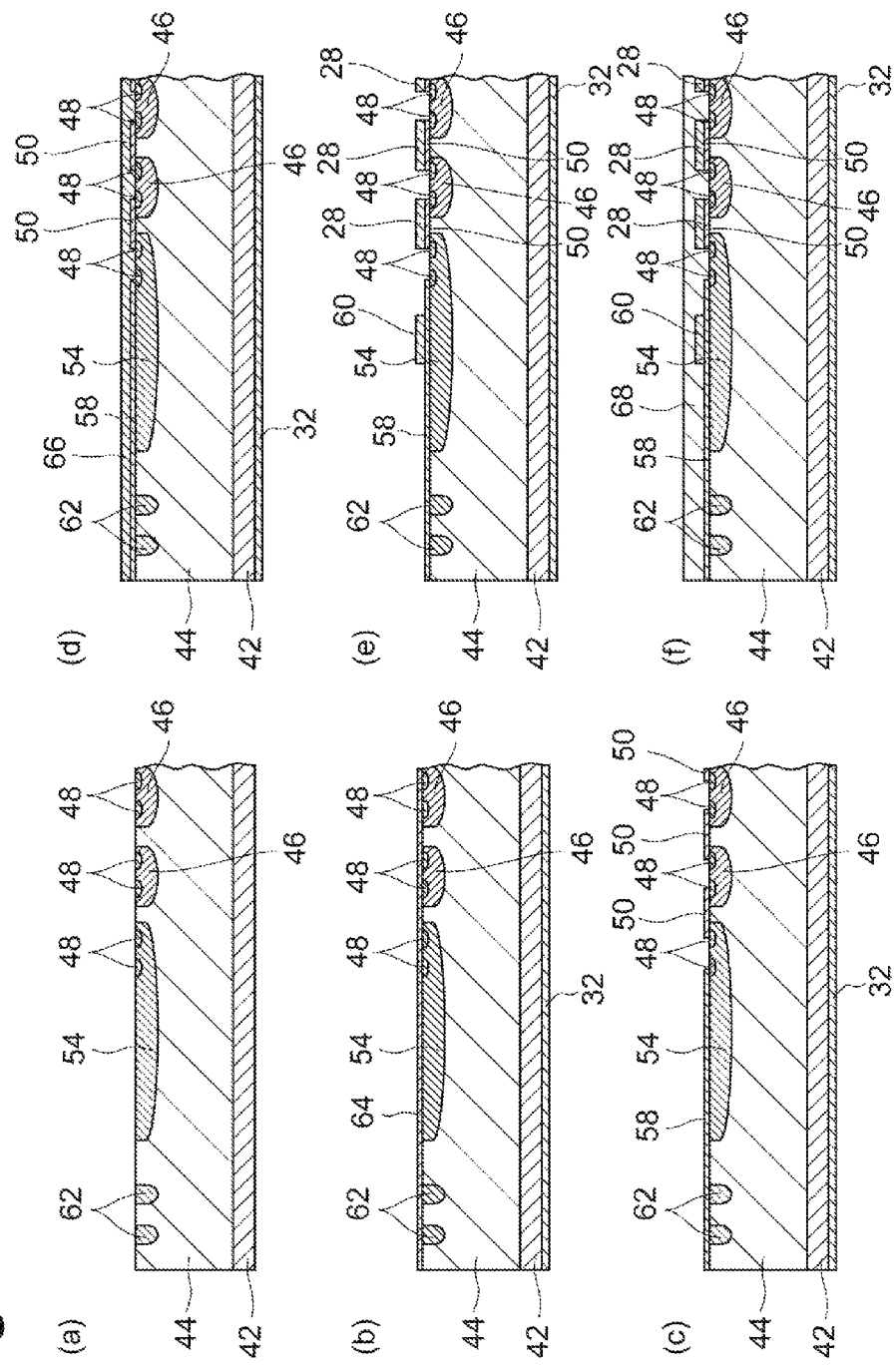
FIG. 5(a) is a schematic view illustrating a process of a method for manufacturing the semiconductor module illustrated in FIG. 1.
FIG. 5(b) is a schematic view illustrating a process subsequent to FIG. 5(a)
FIG. 5(c) is a schematic view illustrating a process subsequent to FIG. 5(b)
FIG. 5(d) is a schematic view illustrating a process subsequent to FIG. 5(c)
FIG. 5(e) is a schematic view illustrating a process subsequent to FIG. 5(d)
FIG. 5(f) is a schematic view illustrating a process subsequent to FIG. 5(e).

The drift layer 44 is formed on the front surface of the semiconductor substrate 42 formed of an n-type SiC substrate, and then the first and second p-type semiconductor regions 46, 54 and the source regions 48 are formed in the surface part of the drift layer 44, as illustrated in FIG. 5(a). When the third p-type semiconductor region 62 is formed, the third p-type semiconductor region 62 is formed together with the second p-type semiconductor region 46 and the like. In the following, an embodiment including the third p-type semiconductor region 62 will be described.

Specifically, the drift layer 44 is formed as an epitaxial growth layer on the front surface of the semiconductor substrate 42 by CVD epitaxial growth method with in-situ doping.

A recess parts are formed to be the first to third p-type semiconductor regions 46, 54, 62 at predetermined positions of the drift layer 44 by reactive ion etching (RIE) and the like. After that, the first to third p-type semiconductor regions 46, 54, 62 are epitaxially grown on a bottom surface and a side surface of each of the recess parts by CVD epitaxial growth method with in-situ doping. In this case, each of the first to third p-type semiconductor regions 46, 54, 62 is a selective embedded growth region.

The plurality of source regions 48 is formed on the first and second p-type semiconductor regions 46, 54 by performing ion injection using an injection mask.

Then, a silicon oxide film 64 is deposited as an insulating film on the drift layer 44 by, for example, CVD method, as illustrated in FIG. 5(b). After that, the drain electrode 32 is formed of a Ni film on the back surface of the semiconductor substrate 42 by an evaporation method, a sputtering method, or the like.

After that, the gate insulating film 50 and the insulating film 58 are formed by patterning the silicon oxide film 64, as illustrated in FIG. 5(c). Subsequently, an Al film 66 is formed on the semiconductor substrate 42 by, for example, CVD method, as illustrated in FIG. 5(d).

The gate electrode 28 and the gate wiring member 60 are formed by patterning the Al film 66, as illustrated in FIG. 5(e).

After that, a second silicon oxide film 68 is further deposited on the semiconductor substrate 42 by, for example, CVD method, to bury the gate electrode 28 and the gate wiring member 60, as illustrated in FIG. 5(f). The second silicon oxide film 68 is the first interlayer insulating film 52 in the cell portion 22, and is the second interlayer insulating film 56 in the circumferential portion 24.

Figure 6:
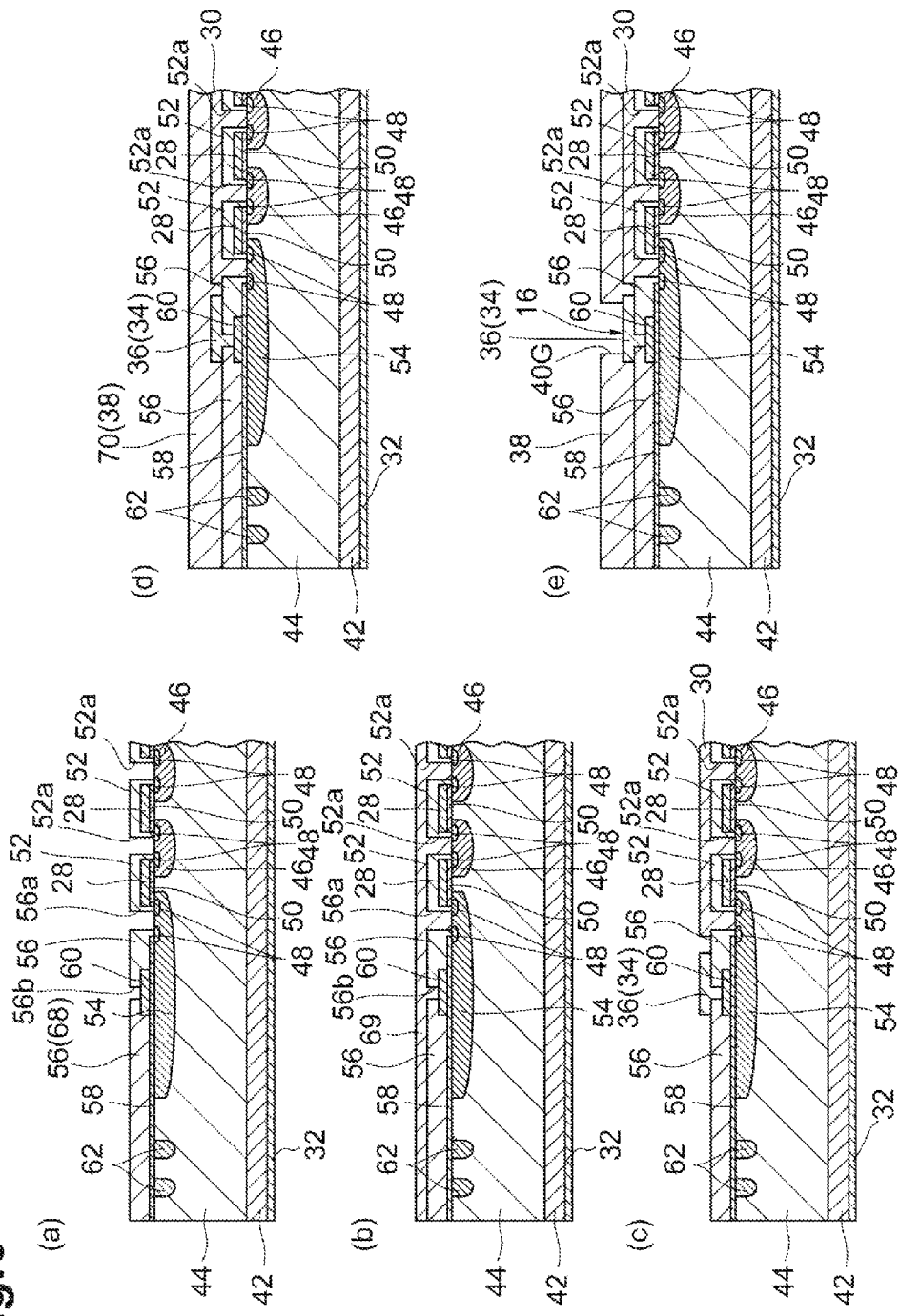
FIG. 6(a) is a schematic view illustrating a process subsequent to FIG. 5(f) in the method for manufacturing the semiconductor module illustrated in FIG. 1.
FIG. 6(b) is a schematic view illustrating a process subsequent to FIG. 6(a)
FIG. 6(c) is a schematic view illustrating a process subsequent to FIG. 6(b)
FIG. 6(d) is a schematic view illustrating a process subsequent to FIG. 6(c)
FIG. 6(e) is a schematic view illustrating a process subsequent to FIG. 6(d).

Subsequently, the first to third contact regions 52a, 56a, 56b are formed in the second silicon oxide film 68, in order to secure electrical contact between each of the source regions 48 and the source electrode 30 and electrical contact between the gate wiring member 60 and the gate electrode wiring 34, as illustrated in FIG. 6(a). The first to third contact regions 52a, 56a, 56b can be formed by using etching and the like.

A Ni film 69 is deposited by, for example, CVD method, on the semiconductor substrate 42 having the second silicon oxide film 68 (the first interlayer insulating film 52 and the second interlayer insulating film 56) on which the first to third contact regions 52a, 56a, 56b are formed, as illustrated in FIG. 6(b). The source electrode 30 and the gate electrode wiring 34 are formed by patterning the Ni film 69, as illustrated in FIG. 6(c). At this time, the pad electrode 36 is formed by forming the gate electrode wiring 34 to have a wide width at a forming position of the gate electrode pad 16. FIG. 6(c) illustrates the gate electrode wiring 34 to which the pad electrode 36 is formed.

Here, the semiconductor substrate 42 is subjected to heat treatment, so that contact is changed from schottky contact to ohmic contact between nickel (Ni) configuring the source electrode 30 and the drain electrode 32 and SiC configuring the source region 48 and the semiconductor substrate 42.

A SiN film 70 is formed by, for example, CVD method, on the semiconductor substrate 42 on which the source electrode 30 is formed, as illustrated in FIG. 6(d). The SiN film 70 is the passivation film 38.

The gate opening portion 40G and the source opening portion 40S are formed in the passivation film 38 to form the gate electrode pad 16 and the source electrode pad 18.

Here, materials and methods for forming the films have been described with some examples of the semiconductor substrate 42, the gate electrode 28, the source electrode 30, the drain electrode 32, and the like; however, the materials and the methods for forming the films of the components configuring the transistor chip 12 are not limited to those exemplified.

<1.2> Wiring Substrate 14

The wiring substrate 14 will be described with reference to FIG. 1 and FIG. 2. The wiring substrate 14 has an insulating substrate 72, and, on the front surface (principal surface) 72a of the insulating substrate 72, a first wiring pattern 74, a second wiring pattern 76, a third wiring pattern 78, a fourth wiring pattern 80, a fifth wiring pattern 82, and a sixth wiring pattern 84 are formed. The first to sixth wiring patterns 74-84 configure a circuit pattern. An example of a material of the first to sixth wiring patterns 74-84 is copper.

An example of a shape in a plan view (a shape viewed from the thickness direction) of the insulating substrate 72 is a quadrilateral shape such as a rectangle or a square, as illustrated in FIG. 1. An example of a material of the insulating substrate 72 includes AlN, SiN, and $Al_2O_3$.

The first wiring pattern 74 has a first chip mounting region 74A, a first external connection region 74B, and a second external connection region 74C.

The first chip mounting region 74A is a region on which the plurality of first and second transistor chips 12A, 12B are mounted.

The first external connection region 74B is a region to which an output terminal is connected for externally outputting an output voltage from the semiconductor module 10A. The first external connection region 74B is physically integrated with the first chip mounting region 74A. In one embodiment, the first external connection region 74B contiguously protrudes from the first chip mounting region 74A. The first external connection region 74B may be arranged in the vicinity of an edge 72b of the insulating substrate 72.

The second external connection region 74C is a region to which a source terminal is connected for externally outputting a source potential that is a reference of the gate voltage as the gate signal for controlling each of the second transistor chips 12B. The second external connection region 74C is physically integrated with the first chip mounting region 74A. In one embodiment, the second external connection region 74C contiguously protrudes toward the outside from the opposite side to the first external connection region 74B in the first chip mounting region 74A. The second external connection region 74C may be arranged in the vicinity of an edge 72c of the insulating substrate 72.

The second wiring pattern 76 is a region to which a gate terminal is connected for inputting the gate voltage supplied to each of the first transistor chips 12A. The second wiring pattern 76 extends in a predetermined direction A in a front surface 72a of the insulating substrate 72. The predetermined direction A is a direction orthogonal to the edge 72b or the edge 72c (a short hand direction in FIG. 1), as illustrated in FIG. 1, and this also applies to other drawings.

The third wiring pattern 78 is a region to which a gate terminal is connected for inputting the gate voltage as the gate signal supplied to each of the second transistor chips 12B. The third wiring pattern 78 extends in the predetermined direction similarly to the second wiring pattern 76.

The fourth wiring pattern 80 is a region to which a terminal is connected for supplying a negative voltage to each of the first transistor chips 12A. The fourth wiring pattern 80 may be arranged in the vicinity of the edge 72b together with the first external connection region 74B.

The fifth wiring pattern 82 is a region to which a terminal is connected for supplying a positive voltage to each of the second transistor chips 12B. The fifth wiring pattern 82 may be arranged in the vicinity of the edge 72b together with the first external connection region 74B and the fourth wiring pattern 80.

The sixth wiring pattern 84 is a third external output region to which a source terminal is connected for externally outputting a source potential that is a reference of the gate voltage for controlling each of the first transistor chips 12A. The sixth wiring pattern 84 may be arranged in the vicinity of the first wiring pattern 74 and the second wiring pattern 76, in the edge 72c side.

<1.3> Specific Configuration of Semiconductor Module 10A

Next, the specific configuration of the semiconductor module 10A will be described with reference to FIG. 1 and FIG. 2.

The plurality of first transistor chips 12A is discretely arranged in the predetermined direction A on the first wiring pattern 74, as illustrated in FIG. 1. The plurality of first transistor chips 12A is arranged on the first chip mounting region 74A of the first wiring pattern 74 so that the drain electrode pad (second main electrode pad) 20 is positioned at the second wiring pattern 76 side.

Each of the plurality of first transistor chips 12A is mounted on the first wiring pattern 74 so that the back surface 12b of each of the first transistor chips 12A faces the front surface 72a of the insulating substrate 72, so that the drain electrode pad 20 is connected to the first wiring pattern 74, as illustrated in FIG. 2.

Specifically, the drain electrode pad 20 is joined to the first chip mounting region 74A via a conductive adhesive such as solder, and each of the first transistor chips 12A is mounted on the first chip mounting region 74A. Thus, the drain electrode pad 20 and the first wiring pattern 74 are electrically connected together.

Since the drain electrode pad 20 faces the first wiring pattern 74, the gate electrode pad (first control electrode pad) 16 and source electrode pad (first main electrode pad) 18 of each of the first transistor chips 12A are positioned at the opposite side to the wiring substrate 14.

The gate electrode pad 16 is connected to the second wiring pattern 76 via a first wire (conducting wire) W1, as illustrated in FIG. 1.

The source electrode pads 18 of the adjacent first transistor chips 12A are connected together via a second wire (conducting wire) W2. In one embodiment, as for wiring via the second wire W2, a thicker second wire W2 may be used, or a plurality of the second wires W2 may be used, for example, to allow a large current to flow. When the plurality of second wires W2 is used, the thicker second wire W2 may be used for at least one of the second wires W2, for example.

Further, the source electrode pads 18 of the plurality of first transistor chips 12A are connected to the fourth and sixth wiring patterns 80, 84 via a third wire (conducting wire) W3 and a fourth wire (conducting wire) W4. For example, of the first transistor chips 12A arranged along the predetermined direction A, a source electrode pad 18 of one of the first transistor chips 12A closest to the fourth wiring pattern 80 and the fourth wiring pattern 80 are connected together via the third wire W3, and a source electrode pad 18 of one of the first transistor chips 12A closest to the sixth wiring pattern 84 and the sixth wiring pattern 84 are connected together via the fourth wire W4.

In one embodiment, as for connection between the source electrode pad 18 and the fourth wiring pattern 80, a thicker third wire W3 may be used, or a plurality of the third wires W3 may be used, to allow a large current to flow. When the plurality of third wires W3 is used, the thicker third wire W3 may be used for at least one of the third wires W3, for example.

This also applies to connection between the source electrode pad 18 and the sixth wiring pattern 84. That is, a thicker fourth wire W4 may be used, or a plurality of the fourth wires W4 may be used. When the plurality of fourth wires W4 is used, the thicker fourth wire W4 may be used for at least one of the fourth wires W4, for example.

Each of the plurality of second transistor chips 12B is mounted on the first and third wiring patterns 74, 78 so that the front surface 12a of each of the second transistor chips 12B faces the front surface 72a of the insulating substrate 72, so that the source electrode pad (third main electrode pad) 18 and the gate electrode pad (second control electrode pad) 16 are respectively connected to the first and third wiring patterns 74, 78, as illustrated in FIG. 2.

Specifically, the source electrode pad 18 and the gate electrode pad 16 are respectively joined to the first and third wiring patterns 74, 78 via a conductive adhesive such as solder, so that each of the second transistor chips 12B is mounted on the first and third wiring patterns 74, 78. Thus, the source electrode pad 18 and the gate electrode pad 16 are electrically connected to the first and third wiring patterns 74, 78, respectively.

Since the source electrode pad 18 faces the first wiring pattern 74, the drain electrode pad (fourth main electrode pad) 20 of each of the second transistor chips 12B is positioned at the opposite side to the wiring substrate 14. The drain electrode pad 20 is connected to the fifth wiring pattern 82 via a fifth wire (conducting wire) W5.

The drain electrode pads 20 of the adjacent second transistor chips 12B are connected together via a sixth wire (conducting wire) W6. Thus, the drain electrode pads 20 are connected together. In one embodiment, as for connection between drain electrode pads 20 of the adjacent second transistor chips 12B, a thicker sixth wire W6 may be used, or a plurality of the sixth wires W6 may be used, for example, to allow a large current to flow. When the plurality of sixth wires W6 is used, the thicker sixth wire W6 may be used for at least one of the sixth wires W6, for example.

The semiconductor module 10A is manufactured as follows, for example. The drain electrode pad 20 of each of the plurality of first transistor chips 12A is joined to the first chip mounting region 74A via a conductive adhesive such as solder. Wiring is performed using the first to fourth wires W1 to W4 described above. In addition, each of the second transistor chips 12B, after solder plating is applied to its gate electrode pad 16 and source electrode pad 18, is arranged at a predetermined position on the wiring substrate 14, and joined to the wiring substrate 14 by reflow. After that, connection is performed using the fifth and sixth wires W5, W6 described above. Thus, the semiconductor module 10A is obtained.

The connections via the first to sixth wires W1 to W6 can be made by, for example, wire bonding. In addition, the connections using the first to sixth wires W1 to W6 may be collectively made after the plurality of first transistor chips 12A, 12B are joined to the wiring substrate 14.

<1.4> Functional Effects of Semiconductor Module 10A

In the semiconductor module 10A, the drain electrode pad 20 of each of the first transistor chips 12A is connected to the first chip mounting region 74A, the gate electrode pad 16 is connected to the second wiring pattern 76 via the first wire W1, and the source electrode pads 18 are connected together via the second wire W2. Therefore, the plurality of first transistor chips 12A is electrically connected together in parallel.

Similarly, the source electrode pad 18 of each of the second transistor chips 12B is connected to the first chip mounting region 74A, the gate electrode pad 16 is connected to the third wiring pattern 78, and the drain electrode pads 20 are connected together via the sixth wire W6. Therefore, the plurality of second transistor chips 12B is electrically connected together in parallel.

Further, the drain electrode pad 20 of each of the first transistor chips 12A and the source electrode pad 18 of each of the second transistor chips 12B are electrically connected together via the first chip mounting region 74A. Therefore, each of the first transistor chips 12A and each of the second transistor chips 12B are electrically connected together in series.

Figure 7:
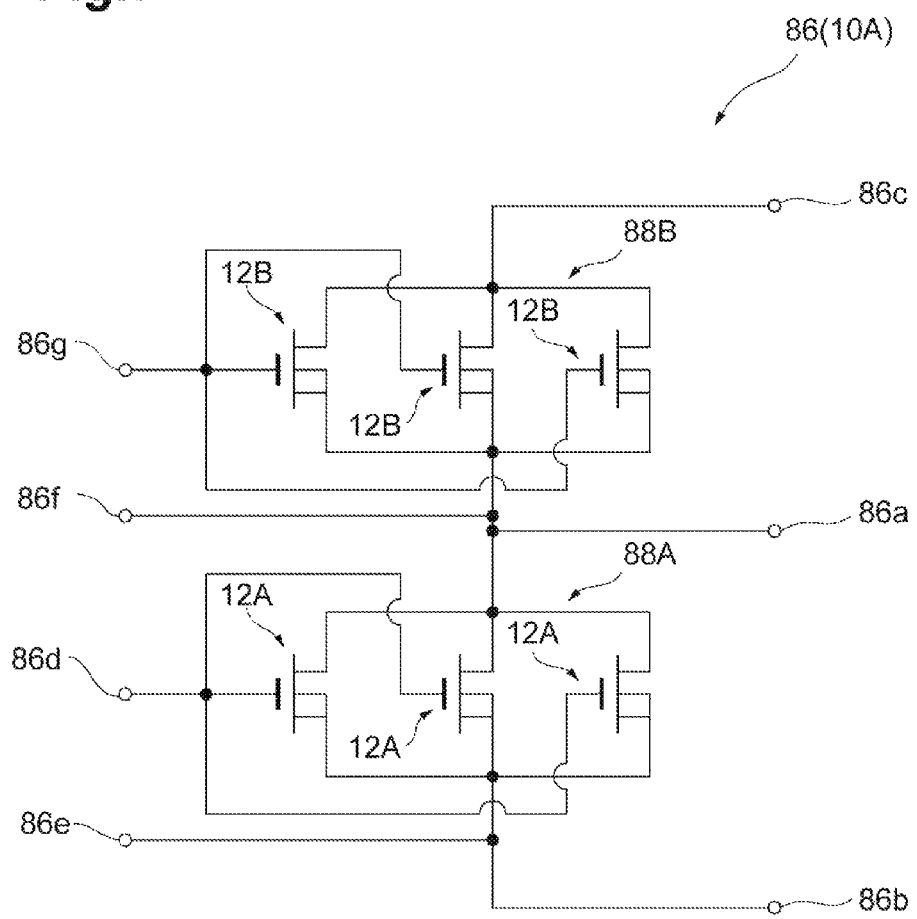
FIG. 7 is a schematic view illustrating an equivalent circuit of the semiconductor module illustrated in FIG. 1.

Therefore, with the configuration of the semiconductor module 10A, an inverter circuit 86 is achieved as an equivalent circuit to the semiconductor module 10A, as illustrated in FIG. 7. For that reason, the semiconductor module 10A can be operated as a power converter that is an inverter.

In the semiconductor module 10A, the plurality of first transistor chips 12A connected together in parallel configures a first semiconductor switch part 88A of the lower arm in the inverter circuit 86, and the plurality of second transistor chips 12B connected together in parallel configures a second semiconductor switch part 88B of the upper arm in the inverter circuit 86. The first and second semiconductor switch parts 88A, 88B are connected together in series.

In FIG. 7, the first external connection region 74B, the fourth wiring pattern 80, and the fifth wiring pattern 82 are schematically illustrated as an output terminal (O terminal) 86a, a negative voltage input terminal (N terminal) 86b, and a positive voltage input terminal (P terminal) 86c, respectively. In addition, the second wiring pattern 76, the sixth wiring pattern 84, the second external connection region 74C, and the third wiring pattern 78 are schematically illustrated as a first gate terminal 86d, a first source terminal 86e, a second source terminal 86f, and a second gate terminal 86g, respectively.

Figure 8:
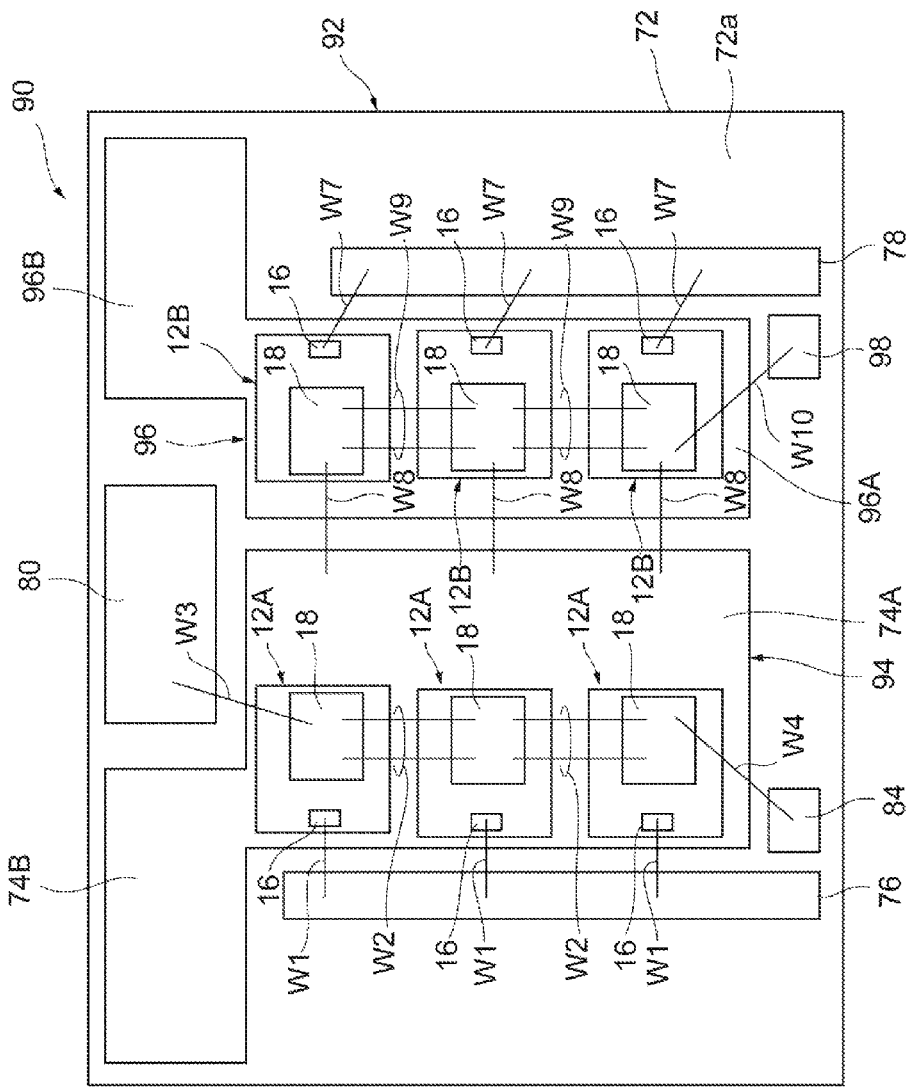
FIG. 8 is a schematic plan view of a semiconductor module for comparing with the semiconductor module illustrated in FIG. 1.

Functional effects of the semiconductor module 10A will be further described while being compared with a semiconductor module 90 illustrated in FIG. 8.

The semiconductor module 90 illustrated in FIG. 8 includes the plurality of first transistor chips 12A, the plurality of second transistor chips 12B, and a wiring substrate 92.

The wiring substrate 92 has the insulating substrate 72, and, on the front surface 72a of the insulating substrate 72, a first wiring pattern 94, the second wiring pattern 76, the third wiring pattern 78, the fourth wiring pattern 80, a fifth wiring pattern 96, the sixth wiring pattern 84, and a seventh wiring pattern 98 are formed.

The first wiring pattern 94 has the first chip mounting region 74A and the first external connection region 74B. The first wiring pattern 94 is different from the first wiring pattern 74 in that the first wiring pattern 94 does not have the second external connection region 74C. The seventh wiring pattern 98 is a region having a function similar to that of the second external connection region 74C in the first wiring pattern 74.

The fifth wiring pattern 96 has a second chip mounting region 96A on which the plurality of second transistor chips 12B is mounted, and an external output region 96B corresponding to the fifth wiring pattern 82 in the wiring substrate 14. The external output region 96B and the second chip mounting region 96A are integrally linked together.

In the semiconductor module 90, the plurality of first transistor chips 12A is mounted on the first wiring pattern 74 similarly to in the semiconductor module 10A.

The plurality of second transistor chips 12B is mounted on the second chip mounting region 96A of the fifth wiring pattern 96 so that the drain electrode pad 20 faces the wiring substrate 92. Thus, the drain electrode pad 20 of each of the second transistor chips 12B and the second chip mounting region 96A are connected together.

The gate electrode pad 16 and the source electrode pad 18 in each of the second transistor chips 12B are respectively connected to the third wiring pattern 78 and the first chip mounting region 74A via a seventh wire W7 and an eighth wire W8. Further, the source electrode pads 18 of the adjacent second transistor chips 12B are connected together via a ninth wire W9. Further, each of the second transistor chips 12B and the seventh wiring pattern 98 are connected together via a tenth wire W10.

When the back surfaces 12b of the first and second transistor chips 12A, 12B are mounted on the wiring substrate 92 as illustrated in FIG. 8, the eighth wire W8 is necessary in order to connect the first and second transistor chips 12A, 12B together in series. In addition, the tenth wire W10 is necessary in order to connect the second transistor chips 12B and the seventh wiring pattern 98 together.

In the semiconductor module 90 as an inverter, the gate voltage input to each of the second transistor chips 12B of the upper arm side is set on the basis of the source potential of the source electrode pad 18 of each of the second transistor chips 12B output from the seventh wiring pattern 98.

Usually, the wire has an inductance component. For that reason, when there are the eighth and tenth wires W8 and W10 in the semiconductor module 90 as described above, a voltage caused by the inductance components of the eighth and tenth wires W8 and W10 (especially, eighth wire W8) gives fluctuation to the source terminal potential of the upper arm side of the inverter.

In addition, when there are many number of wires for wiring associated with the gate electrode pad 16 in each of the second transistor chips 12B, the gate voltage (gate potential) supplied to the gate electrode pad 16 tends to fluctuate.

As a result, erroneous ignition tends to be caused in the semiconductor switch part of the upper arm side including the plurality of second transistor chips 12B connected together in parallel, and unnecessary voltage oscillation is caused when the semiconductor module 90 is driven at a higher frequency (for example, 40 kHz to 100 kHz). For that reason, the semiconductor module 90 cannot be driven at a high frequency.

Further, in the configuration of the semiconductor module 90, it is necessary to form the second chip mounting region 96A for mounting the second transistor chips 12B on the front surface 72a of the insulating substrate 72, separately from the first chip mounting region 74A. As a result, the size of the semiconductor module 90 tends to increase.

On the other hand, in the semiconductor module 10A, the back surface 12b of each of the first transistor chips 12A is made to face the wiring substrate 14, and the drain electrode pad 20 of each of the first transistor chips 12A is connected to the first chip mounting region 74A.

In addition, the front surface 12a of each of the second transistor chips 12B is made to face the wiring substrate 14, and the source electrode pad 18 of each of the second transistor chips 12B is connected to the first chip mounting region 74A.

For that reason, for example, the wire is not necessary for connecting the source electrode pad 18 of each of the second transistor chips 12B and the drain electrode pad 20 of each of the first transistor chips 12A together. That is, the wire (the eighth wire W8 in FIG. 8) is not necessary for electrically connecting the first and second transistor chips 12A, 12B together in series. Further, the tenth wire W10 is not necessary that is necessary in the semiconductor module 90.

As a result, in the semiconductor module 10A, the inductance component due to the wire is reduced as compared with the case of the semiconductor module 90. Thus, in the semiconductor module 10A, the fluctuation of the source terminal potential of the second semiconductor switch part 88B is suppressed. Therefore, erroneous ignition hardly occurs in the second semiconductor switch part 88B connected to the first chip mounting region 74A. For that reason, the semiconductor module 10A can be driven at a higher frequency (for example, 40 kHz to 100 kHz).

Further, in the semiconductor module 10A, the gate electrode pad 16 of each of the second transistor chips 12B is mounted on and connected to the third wiring pattern 78. For that reason, the wire is not necessary for connecting the gate electrode pad 16 and the third wiring pattern 78 together.

Therefore, the inductance component of the ninth wire W9 illustrated in FIG. 8 does not occur for the gate voltage (control voltage) supplied to the third wiring pattern 78. For that reason, in each of the second transistor chips 12B, the fluctuation of the control voltage supplied to the gate electrode pad 16 is further suppressed. As a result, erroneous ignition more hardly occurs in the second semiconductor switch part 88B connected to the first chip mounting region 74A. The semiconductor module 10A can be driven at a higher frequency also in this point.

In addition, since the first transistor chips 12A and the second transistor chips 12B are mounted on the common first chip mounting region 74A, the space required for mounting the second transistor chips 12B can be reduced. As a result, the semiconductor module 10A can be downsized.

Since a MOSFET using a wide band gap semiconductor is used as each of the first and second transistor chips 12A, 12B, the semiconductor module 10A is excellent in the breakdown voltage characteristic, and is capable of high speed operation.

Currently, the size of a semiconductor device using the wide band gap semiconductor tends to be smaller than the conventional semiconductor device using Si. However, because the plurality of first transistor chips 12A is connected together in parallel to configure the first semiconductor switch part 88A, and the plurality of second transistor chips 12B is connected together in parallel to configure the second semiconductor switch part 88B, a large current can be allowed to flow.

In a case in which the first semiconductor switch part 88A and the second semiconductor switch part 88B illustrated in FIG. 7 are respectively configured by the plurality of first and second transistor chips 12A, 12B in this way, when the back surface 12b side is made to face the wiring substrate in both of the first and second transistor chips 12A, 12B as in the semiconductor module 90, the number of unnecessary wires increases as described above.

In addition, since there may be a case in which, for example, the second, third, and fourth wires W2, W3, W4 are made to be thicker, or the number of wires to be used is increased in order to allow a large current to flow in the semiconductor module 10A, the inductance component due to the wire increases when unnecessary wires increase as described above.

On the other hand, in the semiconductor module 10A, the number of wires can be reduced compared to the semiconductor module 90. For that reason, the configuration of the semiconductor module 10A is particularly effective in an embodiment having a wide band gap semiconductor as a semiconductor material of each of the first and second transistor chips 12A, 12B. That is, in the semiconductor module 10A using the wide band gap semiconductor, a large current can be allowed to flow while the high speed operation is achieved in which potential fluctuation is suppressed.

Further, since the number of wires for wiring can be reduced in the semiconductor module 10A, the number of times of wire connection (for example, the number of times of wire bonding) can be reduced. As a result, the semiconductor module 10A can be efficiently manufactured.

<2> Second Embodiment

Figure 9:
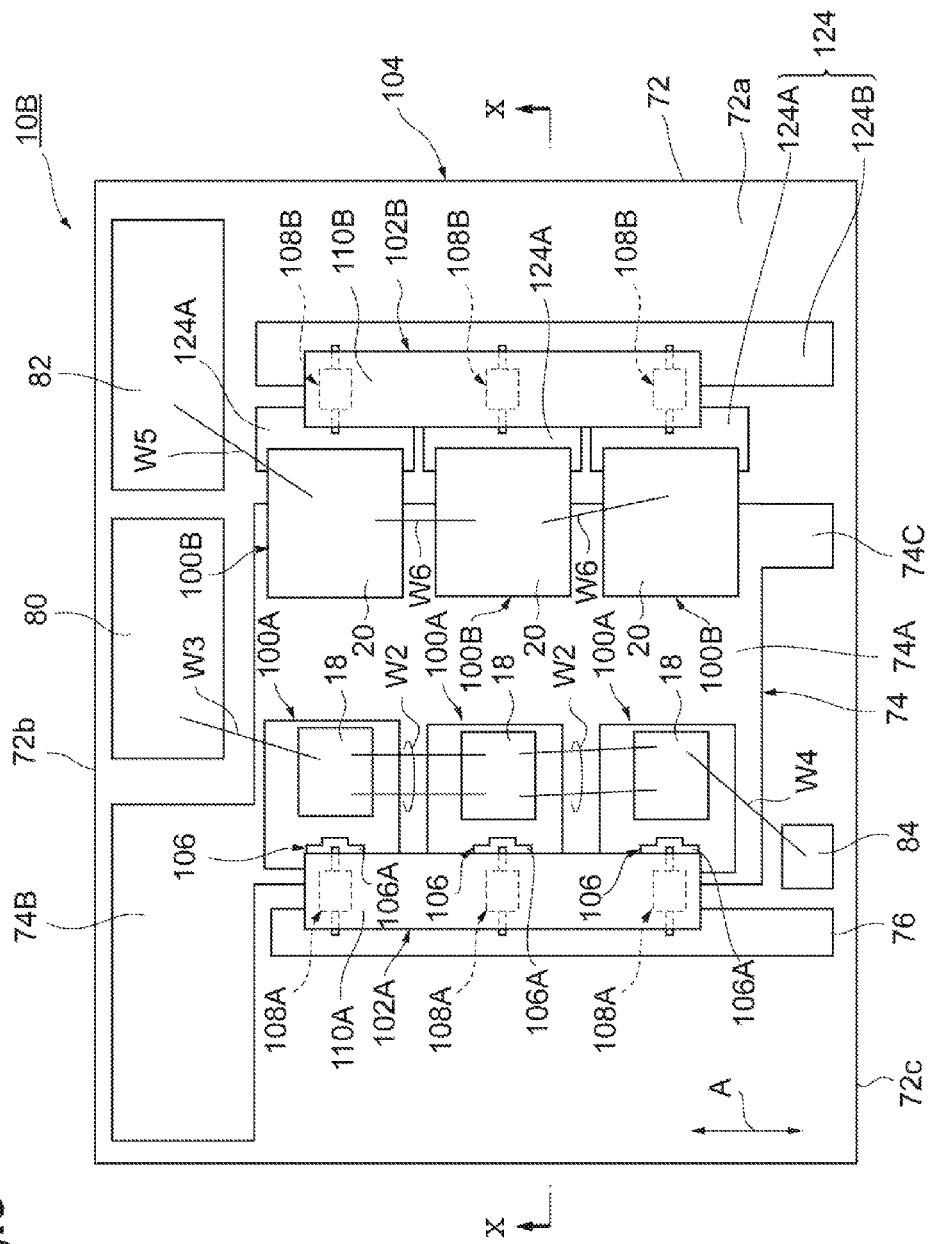
FIG. 9 is a schematic plan view of a semiconductor module according to a second embodiment.
Figure 10:
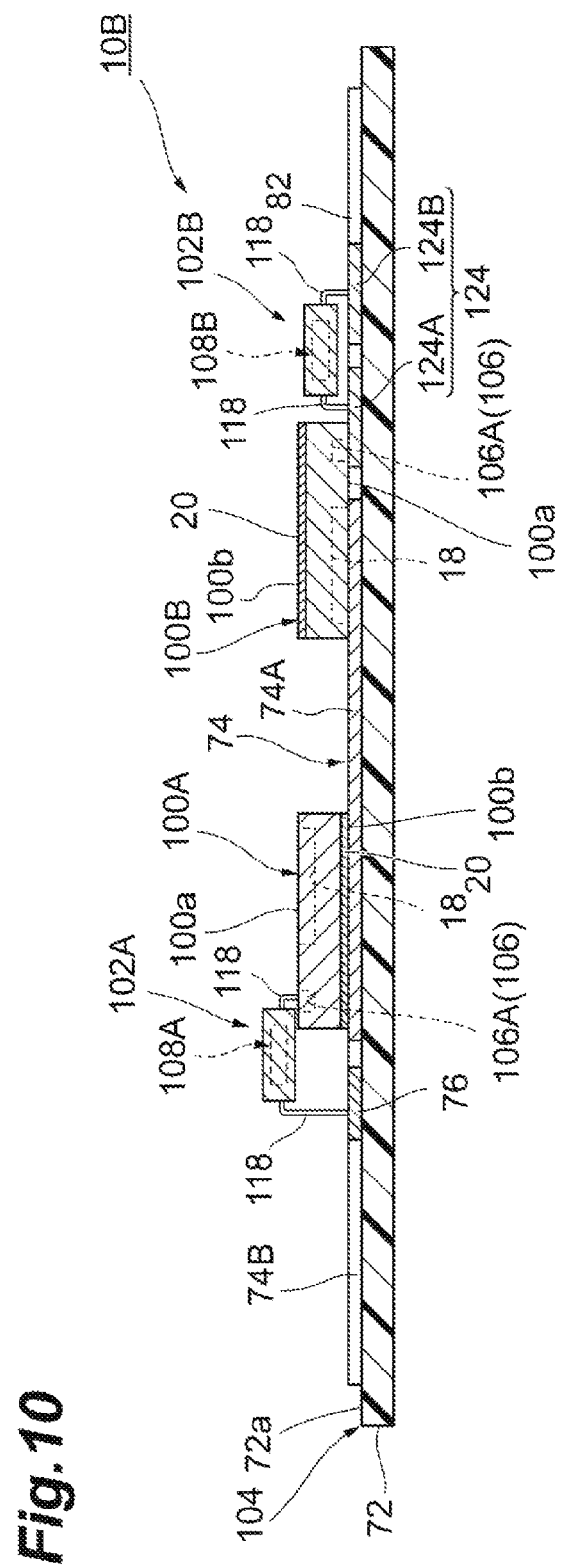
FIG. 10 is a schematic view of a cross section along a line X-X of FIG. 9.

Next, a semiconductor module 10B according to a second embodiment will be described. The semiconductor module 10B includes a plurality of first transistor chips 100A (three in FIG. 9), a plurality of second transistor chips 100B (three in FIG. 9), a first resistance part 102A, a second resistance part 102B, and a wiring substrate 104, as illustrated in FIG. 9 and FIG. 10. The semiconductor module 10B is a single phase inverter as a power converter, similarly to the semiconductor module 10A.

The plurality of first transistor chips 100A is electrically connected together in parallel, and configures a first semiconductor switch part as the lower arm in the power converter. The plurality of second transistor chips 100B is electrically connected together in parallel, and configures a second semiconductor switch part as the upper arm. The first and second semiconductor switch parts are connected together in series.

<2.1> First and Second Transistor Chips 100A, 100B

The first and second transistor chips 100A, 100B will be described with reference to FIG. 11. The configurations of the first and second transistor chips 100A, 100B are the same as each other. For that reason, the configurations of the first and second transistor chips 100A, 100B will be described by referring to each of the first and second transistor chips 100A, 100B as a transistor chip 100. Similarly to the case of the first embodiment, the x-axis and the y-axis set as illustrated in FIG. 11 may be used, for convenience of description.

Figure 11:
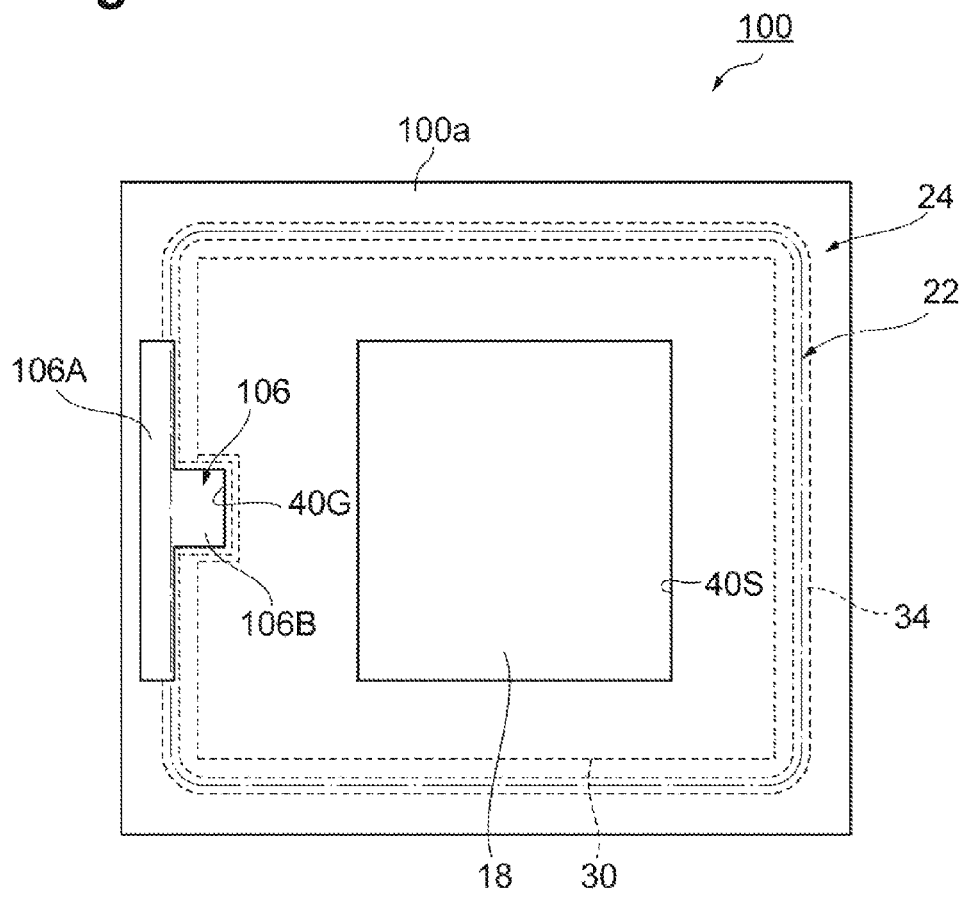
FIG. 11 is a schematic plan view for describing first and second transistors included in the semiconductor module illustrated in FIG. 9.

The configuration of the transistor chip 100 is mainly different from the configuration of the transistor chip 12 in that a gate electrode pad 106 is formed on the front surface as illustrated in FIG. 11, instead of the gate electrode pad 16. Hereinafter, for convenience of description, the front surface and back surface of the transistor chip 100 corresponding to the front surface 12a and back surface 12b of the transistor chip 12 are referred to as front surface 100a and back surface 100b, respectively.

The transistor chip 100 is a vertical metal-oxide-semiconductor field-effect transistor (MOSFET) in which the gate electrode pad 106 and a source electrode pad 18 are formed on the front surface 100a, and a drain electrode pad 20 is formed on the back surface 100b.

An example of a semiconductor material of the transistor chip 100 is a wide band gap semiconductor, and an example of the wide band gap semiconductor includes SiC and GaN. The transistor chip 100 has a cell portion 22 and a circumferential portion 24 similar to those of the transistor chip 12.

The gate electrode pad 106 has a resistance connection region 106A extending in one direction (the y-axis direction in FIG. 11), as illustrated in FIG. 11. In one embodiment, at least a part of the resistance connection region 106A may be provided on the circumferential portion 24. For example, the resistance connection region 106A may protrude from the outer edge of the cell portion 22 toward the circumferential portion 24 side, as illustrated in FIG. 11.

In one embodiment, the gate electrode pad 106 may have a probe connection region 106B protruding from a part in the extending direction of the resistance connection region 106A. The probe connection region 106B is a region to which an inspection probe is connected for inspecting the transistor chip 100.

The probe connection region 106B may protrude from the outer edge of the cell portion 22 toward the inside of the cell portion 22, for example, as illustrated in FIG. 11.

The transistor chip 100 can be manufactured in a similar manner to the method for manufacturing the transistor chip 12, other than that a pad electrode 36 is formed in accordance with the shape of the gate electrode pad 106, and a gate opening portion 40G is formed in accordance with the shape of the gate electrode pad 106 in a passivation film 38, in the method for manufacturing the transistor chip 12.

<2.2> First and Second Resistance Parts 102A, 102B

Next, the first and second resistance parts 102A, 102B will be described. The first resistance part 102A has a plurality of first resistance elements 108A corresponding to the respective plurality of first transistor chips 100A, and a first resin part 110A as an insulating linking part linking the resistance elements 108A together, as illustrated in FIG. 9. Similarly, the second resistance part 102B has a plurality of second resistance elements 108B corresponding to the respective plurality of second transistor chips 100B, and a second resin part 110B as an insulating linking part linking the resistance elements 108B together, as illustrated in FIG. 9.

The configurations of the first and second resistance parts 102A, 102B will be described in details with reference to FIG. 12 to FIG. 14. Since the configurations of the first and second resistance parts 102A, 102B are substantially the same as each other, the first and second resistance parts 102A, 102B will be described by referring to each of the first and second resistance parts 102A, 102B as a resistance part 102. Similarly, each of the first and second resistance elements 108A, 108B and each of the first and second resin parts 110A, 110B are referred to as a resistance element 108 and a resin part 110, respectively.

Figure 12:
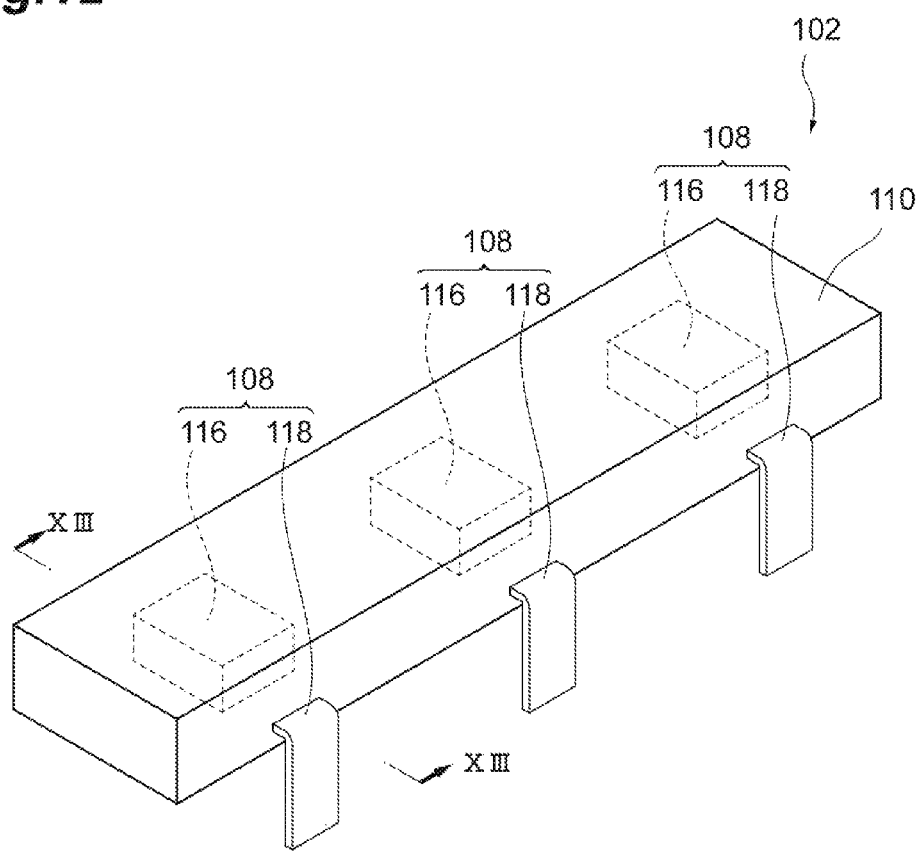
FIG. 12 is a schematic perspective view for describing first and second resistance parts included in the semiconductor module illustrated in FIG. 9.

The resistance part 102 has a plurality of resistance elements 108, and the plurality of resistance elements 108 is linked together by the resin part 110 as a linking part and integrated together, as illustrated in FIG. 12. Since the resistance elements 108 are arranged in parallel discretely in one direction, the resistance part 102 extends in the one direction.

The resistance elements 108 function as gate resistances for preventing fluctuation of the gate voltage in high speed operation of the semiconductor module 10B, in the semiconductor module 10B. Resistance values of the resistance elements 108 may be the same as each other; however, resistance values may be increased of the resistance elements 108 arranged at the input side of the gate voltage in the semiconductor module 10B.

Figure 13:
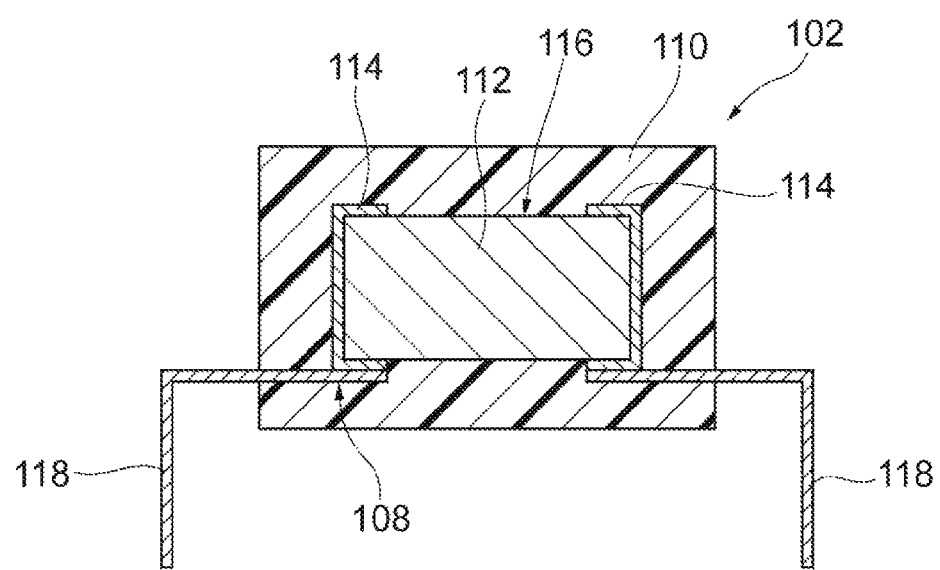
FIG. 13 is a schematic view of a cross section along a line XIII-XIII of FIG. 12.
Figure 14:
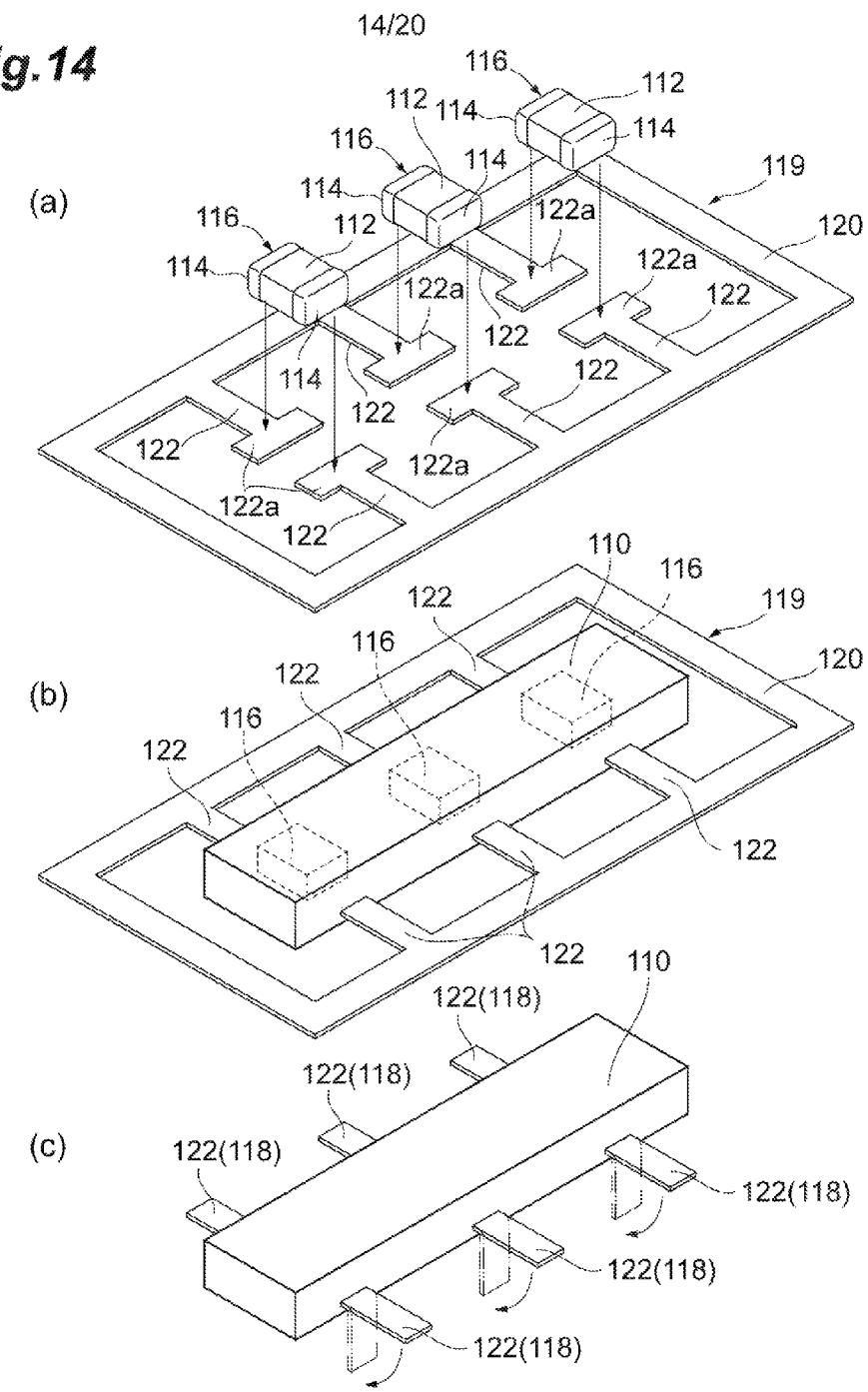
FIG. 14(a) is a schematic view illustrating a process of a method for manufacturing the resistance part illustrated in FIG. 12.
FIG. 14(b) is a schematic view illustrating a process subsequent to FIG. 14(a)
FIG. 14(c) is a schematic view illustrating a process subsequent to FIG. 14(b).

Each of the resistance elements 108 has a body part 116 configured so that both ends of a resistor 112 are covered by respective conductive films 114, and each of the conductive films 114 is connected to a lead (terminal) 118 that is a plate shaped conductive member, as illustrated in FIG. 13. The body part 116 and the lead 118 are connected together by using a conductive adhesive such as solder, for example.

The body part 116 is buried in the resin part 110, and a free end (an end opposite to a connecting portion of the body part 116) of each lead 118 protrudes from the resin part 110 to the outside. A portion protruding from the resin part 110 of each lead 118 is bent.

In FIG. 13, for convenience of description, the lengths of two leads 118 are the same as each other; however, the lengths of the leads 118 are adjusted according to a connection form to a target to be connected to the resistance part 102.

The resistance part 102 is manufactured as follows, for example. A lead frame 119 having conductivity, and the plurality of body parts 116 (three in FIG. 14(a)) are prepared, as illustrated in FIG. 14(a).

The lead frame 119 has a plate-shaped frame 120 and a plurality of pair of leads 122 each of which extends to the inside from the edges facing each other of the frame 120 (three pair of leads 122 are illustrated in FIG. 14(a)). Each of the pair of leads 122 is a plate-shaped conductive member. The length in an extending direction of each of the leads 122 is shorter than the length (width) of the frame 120 in the extending direction, and free ends 122a of the pair of leads 122 are apart from each other.

The body part 116 is mounted on the pair of leads 122, 122 by using a conductive adhesive member such as solder so that the free ends 122a of the pair of leads 122, 122 are linked together by the body part 116.

Subsequently, the plurality of body parts 116 is molded with resin to form the resin part 110 linking the body parts 116 together, as illustrated in FIG. 14(b). After that, the pair of leads 122, 122 is detached from the frame 120, and the leads 122 protruding from the resin part 110 are bent, as illustrated in FIG. 14(c).

The pair of leads 122, 122 detached from the frame 120 and connected to the body part 116 is the leads 118 of the resistance element 108. For that reason, when the leads 122 are detached from the frame 120, the length of each of the leads 122 protruding from the resin part 110 is adjusted to the length according to the connection form to the target to be connected to the resistance part 102.

With the process described above, the resistance part 102 can be manufactured in which the resistance elements 108 each of which includes the body part 116 and the leads 118 linked to the body part 116 are linked together by the resin part 110. Incidentally, here, the resin part 110 is exemplified as the linking part linking the resistance elements 108 together; however, it is sufficient that the linking part can connect the plurality of resistance elements 108 together while insulating the resistance elements 108 from each other.

<2.3> Wiring Substrate 104

The wiring substrate 104 will be described with reference to FIG. 9 and FIG. 10. The wiring substrate 104 has an insulating substrate 72, and, on the front surface 72a of the insulating substrate 72, a first wiring pattern 74, a second wiring pattern 76, a third wiring pattern 124, a fourth wiring pattern 80, a fifth wiring pattern 82, and a sixth wiring pattern 84 are formed.

The wiring substrate 104 is different from the configuration of the wiring substrate 14 illustrated in FIG. 1 in that the third wiring pattern 124 is formed on the front surface 72a instead of the third wiring pattern 78. The wiring substrate 104 will be described mainly on this difference.

The third wiring pattern 124 has a plurality of pad connection regions 124A, and a gate terminal connection region 124B.

The plurality of pad connection regions 124A is chip corresponding regions provided corresponding to the respective second transistor chips 100B, and is insulated from each other. Each of the pad connection regions 124A is connected to the gate electrode pad 106 of the corresponding second transistor chip 100B.

The gate terminal connection region 124B is an external connection region to which the gate terminal is connected for inputting the gate voltage to the gate electrode pad 106 of each of the second transistor chips 100B. The gate terminal connection region 124B extends in the predetermined direction A, and is insulated from the plurality of pad connection regions 124A.

(2.4) Specific Configuration of Semiconductor Module 10B

Next, specific configurations will be described of the first and second transistor chips 100A, 100B in the semiconductor module 10B.

As illustrated in FIG. 9, the plurality of first transistor chips 100A is mounted on the first chip mounting region 74A of the first wiring pattern 74 similarly to the case in which the plurality of first transistor chips 12A is mounted on the first chip mounting region 74A. In the semiconductor module 10B, each of the first transistor chips 100A is arranged so that the extending direction of the resistance connection region 106A is directed to the predetermined direction A, as illustrated in FIG. 9.

Also in the second embodiment, similarly to the case of the first embodiment, the gate electrode pad (first control electrode pad) 106 of each of the first transistor chips 100A and the source electrode pad (first main electrode pad) 18 are positioned at the opposite side to the wiring substrate 104.

The gate electrode pad 106 is connected to the second wiring pattern 76 via the first resistance part 102A. Specifically, one lead 118 of each of the first resistance elements 108A included in the first resistance part 102A and the resistance connection region 106A of the gate electrode pad 106 of the corresponding first transistor chip 100A are physically connected together via a conductive adhesive such as solder, as illustrated in FIG. 10. In addition, the other lead 118 of each of the first resistance elements 108A is physically connected to the second wiring pattern 76 via a conductive adhesive such as solder.

Since the gate electrode pad 106 of each of the first transistor chips 100A is positioned at the opposite side to the wiring substrate 104, the position of the gate electrode pad 106 is substantially higher than the position of the front surface 72a of the insulating substrate 72 by the thickness of each of the first transistor chips 100A.

For that reason, of the pair of leads 118 of each of the first resistance elements 108A, the lead 118 connected to the gate electrode pad 106 is shorter than the lead 118 connected to the second wiring pattern 76.

A point that the source electrode pads 18 of the adjacent first transistor chips 100A are connected together via the second wire W2, and a point that the source electrode pads 18 and the fourth and sixth wiring patterns 80, 84 are connected together respectively via the third wire W3 and the fourth wire W4 are similar to those in the first embodiment, as illustrated in FIG. 9.

Each of the plurality of second transistor chips 100B is mounted on the first wiring pattern 74 and the pad connection region 124A so that the front surface 12a of each of the second transistor chips 100B faces the front surface 72a of the wiring substrate 104, so that the source electrode pad (third main electrode pad) 18 and the gate electrode pad (second main electrode pad) 106 are connected to the first wiring pattern 74 and the pad connection region 124A, respectively, as illustrated in FIG. 10.

Specifically, the source electrode pad 18 and the gate electrode pad 106 are respectively joined to the first wiring pattern 74 and the pad connection region 124A via a conductive adhesive such as solder, so that each of the second transistor chips 100B is mounted on the first wiring pattern 74 and the pad connection region 124A. Thus, the source electrode pad 18 and the gate electrode pad 106 are electrically connected to the first wiring pattern 74 and the pad connection region 124A, respectively.

Since each of the second transistor chips 100B is mounted on the wiring substrate 104 so that the source electrode pad 18 faces the first wiring pattern 74, the drain electrode pad (second main electrode pad) 20 of each of the second transistor chips 100B is positioned at the opposite side to the wiring substrate 104. A point that the drain electrode pad 20 of each of the second transistor chips 100B is connected to the fifth wiring pattern 82 via the fifth wire W5 is similar to that in the first embodiment.

Each of the pad connection regions 124A is connected to the gate terminal connection region 124B via the second resistance part 102B. Specifically, one lead 118 of each of the second resistance elements 108B included n the second resistance part 102B is physically connected to the corresponding pad connection region 124A via a conductive adhesive such as solder, and the other lead 118 of each of the second resistance elements 108B is physically connected to the gate terminal connection region 124B via a conductive adhesive such as solder, as illustrated in FIG. 10.

As for the second resistance part 102B, in order to connect each of the pad connection regions 124A and the gate terminal connection region 124B together, the lengths of the pair of leads 118 of each of the second resistance elements 108B can be the same as each other.

The semiconductor module 10B is manufactured as follows, for example. Solder plating is performed to the gate electrode pad 106 and the source electrode pad 18 of each of the first transistor chips 100A. Similarly, solder plating is performed to the drain electrode pad 20 of each of the second transistor chips 100B. Similarly, solder plating is performed to each lead 118 included in the first and second resistance parts 102A, 102B.

After that, the plurality of first and second transistor chips 100A, 100B and the first and second resistance parts 102A, 102B are arranged as illustrated in FIG. 9. Those are collectively joined to the wiring substrate by reflow.

Subsequently, wiring using the third wire W3, fourth wire W4, fifth wire W5, and sixth wire W6 is performed as appropriate. The wiring can be made by, for example, wire bonding.

<2.5> Functional Effects of Semiconductor Module 10B

In the semiconductor module 10B, the drain electrode pad (second main electrode pad) 20 of each of the first transistor chips 100A is connected to the first chip mounting region 74A, the gate electrode pad 106 is connected to the second wiring pattern 76 via the first resistance element 108A, and the source electrode pads 18 are connected together via the second wire W2. Therefore, the plurality of first transistor chips 100A is electrically connected together in parallel.

Similarly, the source electrode pad 18 of each of the second transistor chips 100B is connected to the first chip mounting region 74A, the gate electrode pad 106 is connected to the gate terminal connection region 124B via the pad connection region 124A and second resistance element 108B, and the drain electrode pads 20 are connected together via the sixth wire W6. Therefore, the plurality of second transistor chips 100B is electrically connected together in parallel.

Further, the drain electrode pad 20 of each of the first transistor chips 100A and the source electrode pad 18 of each of the second transistor chips 100B are electrically connected together via the first chip mounting region 74A. Therefore, each of the first transistor chips 100A and each of the second transistor chips 100B are electrically connected together.

Therefore, the semiconductor module 10B can be operated as a power converter that is an inverter, similarly to the semiconductor module 10A.

The semiconductor module 10B has the first resistance part 102A and the second resistance part 102B in the module.

Each of the first resistance elements 108A of the first resistance part 102A functions as a gate resistance for the corresponding first transistor chip 100A. For that reason, in the semiconductor module 10B, fluctuation of the gate voltage (control voltage) supplied to each of the first transistor chips 100A can be suppressed by each of the first resistance elements 108A.

Similarly, each of the second resistance elements 108B of the second resistance part 102B functions as a gate resistance for the corresponding second transistor chip 100B. For that reason, in the semiconductor module 10B, fluctuation of the gate voltage (control voltage) supplied to each of the second transistor chips 100B can be suppressed by each of the second resistance elements 108B.

Figure 15:
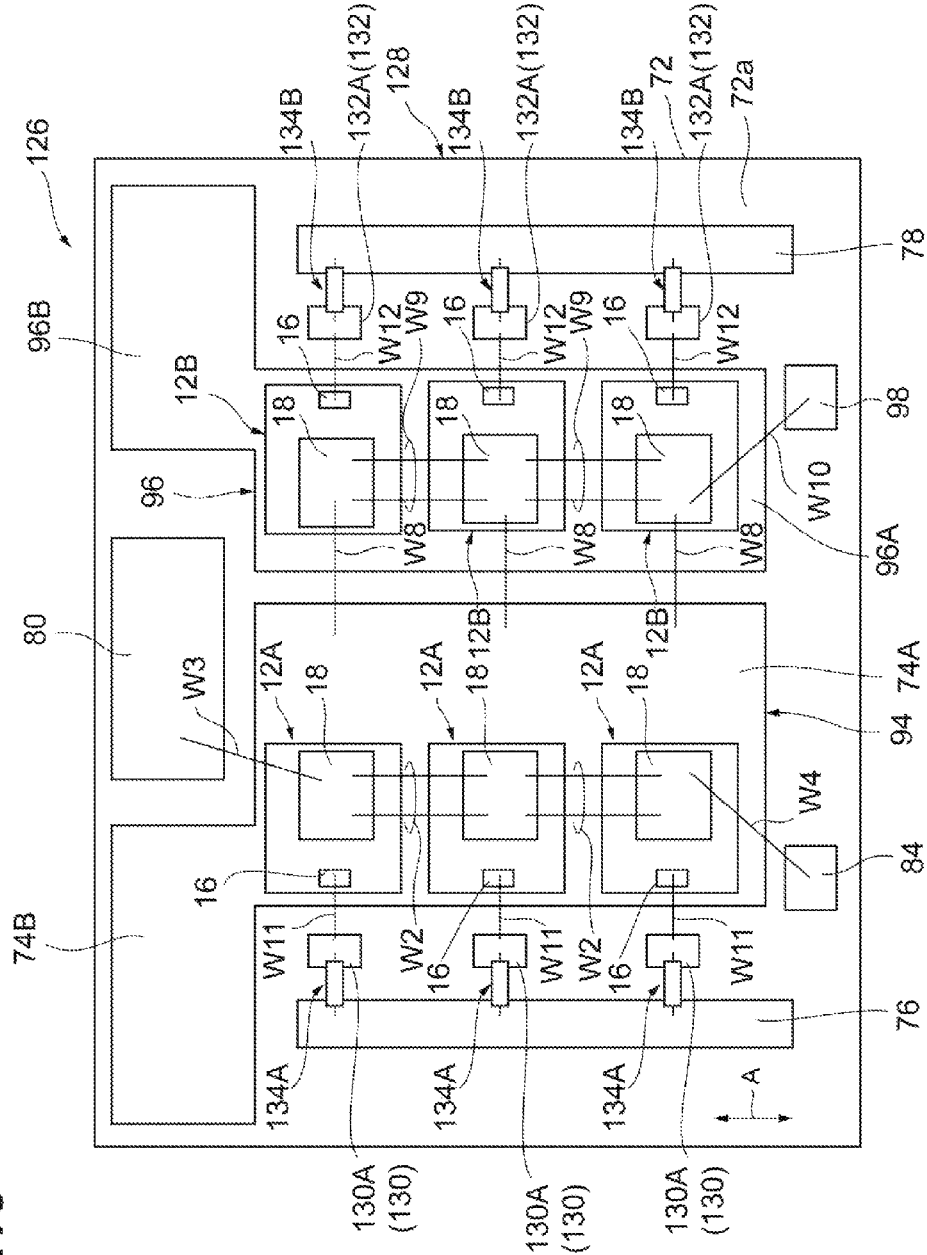
FIG. 15 is a schematic plan view of a semiconductor module for comparing with the semiconductor module illustrated in FIG. 9.

Functional effects of the semiconductor module 10B will be further described while being compared with a case of a semiconductor module 126 illustrated in FIG. 15.

The semiconductor module 126 illustrated in FIG. 15 includes a wiring substrate 128, and the plurality of first transistor chips 12A and the plurality of second transistor chips 12B described in the first embodiment.

The wiring substrate 128 has the insulating substrate 72. On the front surface 72a of the insulating substrate 72, similarly to the case of the wiring substrate 92, the first wiring pattern 94, the second wiring pattern 76, the third wiring pattern 78, the fourth wiring pattern 80, the fifth wiring pattern 96, the sixth wiring pattern 84, and the seventh wiring pattern 98 are formed.

Further, on the front surface 72a, eighth wiring patterns 130 and ninth wiring patterns 132 for resistance connection are formed.

The eighth wiring patterns 130 have respective resistance connection regions 130A respectively corresponding to the plurality of first transistor chips 12A. Each of the resistance connection regions 130A is a region to which a gate resistance 134A is connected corresponding to each of the plurality of first transistor chips 12A. The plurality of resistance connection regions 130A is insulated from each other, and is arranged discretely in the predetermined direction A between the first chip mounting region 74A of the first wiring pattern 94 and the second wiring pattern 76.

The ninth wiring patterns 132 have respective resistance connection regions 132A respectively corresponding to the plurality of second transistor chips 12B. Each of the resistance connection regions 132A is a region to which a gate resistance 134B is connected corresponding to each of the plurality of second transistor chips 12B. The plurality of resistance connection regions 132A is insulated from each other, and is arranged discretely in the predetermined direction A between the second chip mounting region 96A of the fifth wiring pattern 96 and the third wiring pattern 78.

In the semiconductor module 126, the plurality of first transistor chips 12A is mounted on the first wiring pattern 74, similarly to the case of the semiconductor module 90. Similarly, the plurality of second transistor chips 12B is mounted on the second chip mounting region 96A, similarly to the case of the semiconductor module 90.

In the semiconductor module 126, the gate electrode pad 16 of each of the first transistor chips 12A is connected to the corresponding resistance connection region 130A via an eleventh wire W11. Each of the resistance connection regions 130A is connected to the second wiring pattern 76 via the gate resistance 134A.

Since each of the second transistor chips 12B is mounted on the wiring substrate 128 so that the drain electrode pad 20 faces the wiring substrate 128 in the semiconductor module 126, the gate electrode pad 16 and the source electrode pad 18 are positioned at the opposite side to the wiring substrate 128 in each of the second transistor chips 12B as well.

The source electrode pad 18 of each of the second transistor chips 12B is connected to the first chip mounting region 74A and the seventh wiring pattern 98 respectively via the eighth wire W8 and the tenth wire W10. Further, the source electrode pads 18 of the adjacent second transistor chips 12B are connected together via a ninth wire W9.

Further, the gate electrode pad 16 of each of the second transistor chips 12B is connected to the corresponding resistance connection region 132A via a twelfth wire W12. Each of the resistance connection regions 132A is connected to the third wiring pattern 78 via the gate resistance 134B.

In the semiconductor module 126, similarly to the case of the semiconductor module 90, each of the first and second transistor chips 12A, 12B is mounted on the wiring substrate 128 so that the back surface 12b faces the wiring substrate 128. For that reason, the semiconductor module 126 has a problem similar to that in the case of the semiconductor module 90.

Further, in the semiconductor module 126, each of the resistance connection regions 130A, 132A and the gate electrode pad 16 of the corresponding first and second transistor chips 12A, 12B are connected together respectively via the eleventh wire W11 and the twelfth wire W12. For that reason, the number of wires associated with the gate electrode pad 16 is further increased compared to the semiconductor module 90. Therefore, fluctuation of the gate potential due to the inductance component of the wire tends to occur. This is more prominent when the semiconductor module 126 is made to perform high speed operation, that is, when it is operated at a high frequency.

In the semiconductor module 126, the resistance connection regions 130A, 132A have to be further formed on the front surface 72a, as compared with the configuration of the semiconductor module 90. For that reason, downsizing is more difficult in the semiconductor module 126 than in the semiconductor module 90.

On the other hand, in the semiconductor module 10B, similarly to the semiconductor module 10A, the first and second transistor chips 100A, 100B are mounted on the wiring substrate 104 in a state in which the front and back of the first and second transistor chips 100A, 100B are reversed to each other. For that reason, the drain electrode pad 20 of each of the first transistor chips 100A and the source electrode pad 18 of each of the second transistor chips 100B can be connected together via the first chip mounting region 74A.

Therefore, the semiconductor module 10B has at least functional effects similar to those of the semiconductor module 10A. That is, in the semiconductor module 10B, source potential fluctuation due to the inductance component of the wire can be suppressed of the upper arm side. For that reason, the semiconductor module 10B can be driven at a high frequency. Further, since the semiconductor material of each of the first and second transistor chips 100A, 100B is a wide band gap semiconductor, each of the first and second transistor chips 100A, 100B is excellent in the breakdown voltage characteristic, and is capable operation at a high frequency. For that reason, in the semiconductor module 10B, a large current can be allowed to flow while the high speed operation is achieved.

In the semiconductor module 10B, the first resistance part 102A is directly connected to each of the first transistor chips 100A and the second wiring pattern 76. For that reason, as in the semiconductor module 126, the eighth wiring pattern 130 is not necessary, nor the eleventh wire W11 is not necessary for connecting the eighth wiring pattern 130 and each of the first transistor chips 100A together.

Therefore, in the configuration including the first resistance part 102A, the number of wires is reduced in the first transistor chip 100A side (lower arm side). For that reason, influence of the inductance component of the wire can be reduced. Thus, the fluctuation of the gate potential at a high frequency of the first transistor chip 100A side is suppressed. As a result, high speed operation of the semiconductor module 10B is possible further. Further, since the eighth wiring pattern 130 is not necessary, the semiconductor module 10B can be downsized.

In the semiconductor module 10B, the gate electrode pad 106 of each of the second transistor chips 100B is directly connected to the pad connection region 124A via solder or the like. For that reason, the twelfth wire W12 is not necessary for connecting the gate electrode pad 106 and the pad connection region 124A together.

Therefore, in the configuration including the second resistance part 102B, the number of wires is reduced in the second transistor chip 100B side (upper arm side). Influence of the inductance component of the wire can be reduced by reducing the number of wires in the second transistor chip 100B side. Thus, in the semiconductor module 10B, the fluctuation of the gate potential at a high frequency is suppressed. As a result, high speed operation of the semiconductor module 10B is possible further.

Since the number of wires for wiring can be reduced also in the semiconductor module 10B, the number of times of wire connection (for example, the number of times of wire bonding) can be reduced. As a result, semiconductor module 10B can be efficiently manufactured.

In the first resistance part 102A, the plurality of first resistance elements 108A is linked by the first resin part 110A to be integrated together. For that reason, the first resistance part 102A has three or more leads 118. Thus, the first resistance part 102A physically stands more easily than the discrete first resistance element 108A (or the gate resistance 134A in the semiconductor module 126) itself. For that reason, the first resistance part 102A is easily connected to the resistance connection region 106A. Therefore, misalignment hardly occurs when each of the first resistance elements 108A and the resistance connection region 106A are connected together.

Similarly, in the second resistance part 102B, the plurality of second resistance elements 108B is linked by the second resin part 110B to be integrated together. For that reason, the second resistance part 102B physically stands more easily than the discrete second resistance element 108B itself. Thus, when the second resistance part 102B is used, the second resistance part 102B is mounted to the pad connection regions 124A and the like more easily than when each of the pad connection regions 124A and the gate terminal connection region 124B are connected together via the discrete second resistance element 108B.

In addition, since the second resistance part 102B easily stands by itself, and the second resistance part 102B is easily mounted to the pad connection regions 124A and the like, similarly to the case of the first resistance part 102A, misalignment hardly occurs when each of the second resistance elements 108B of the second resistance part 102B and the pad connection region 124A are connected together. For that reason, the area of each of the pad connection regions 124A can be reduced. As a result, the semiconductor module 10B can be further downsized.

Further, the gate electrode pad 106 of each of the first transistor chips 100A has a resistance connection region 106A extending along the arrangement direction of the plurality of first transistor chips 100A. For that reason, a larger region of the connection region can be secured for connecting the lead 118 thereto. Therefore, misalignment can be further reduced between the resistance element 108 of the first resistance part 102A and the first transistor chip 100A.

In each of the first transistor chips 100A mounted on the wiring substrate 104, the resistance connection region 106A extends in the predetermined direction A. For that reason, misalignment can be further reduced of the first resistance part 102A when the gate electrode pad 106 and the first resistance part 102A are connected together.

In one embodiment, at least a part of the resistance connection region 106A is provided on the circumferential portion 24. For example, the resistance connection region 106A protrudes from the cell portion 22 toward the circumferential portion 24 to the outside, as illustrated in FIG. 11. The circumferential portion 24 is provided for securing the breakdown voltage characteristic, and is a region not substantially contributing to transistor operation. Because at least a part of the resistance connection region 106A is provided on the circumferential portion 24, a region of the cell portion 22 substantially functioning as a transistor function can be secured even when the resistance connection region 106A is formed.

In one embodiment, the gate electrode pad 106 has a probe connection region 106B. Usually, the inspection probe is in contact with the gate electrode pad of the transistor chip and stress is added, for inspecting whether or not the transistor chip normally operates.

In an embodiment in which the gate electrode pad 106 has the probe connection region 106B separately from the resistance connection region 106A, a region with which the inspection probe is in contact and a region to which the resistance is connected can be distinguished from each other. For that reason, no extra stress is added to the resistance connection region 106A during inspection, and the resistance connection region 106A can be used in an optimum state for resistance connection.

<3> Third Embodiment

Figure 16:
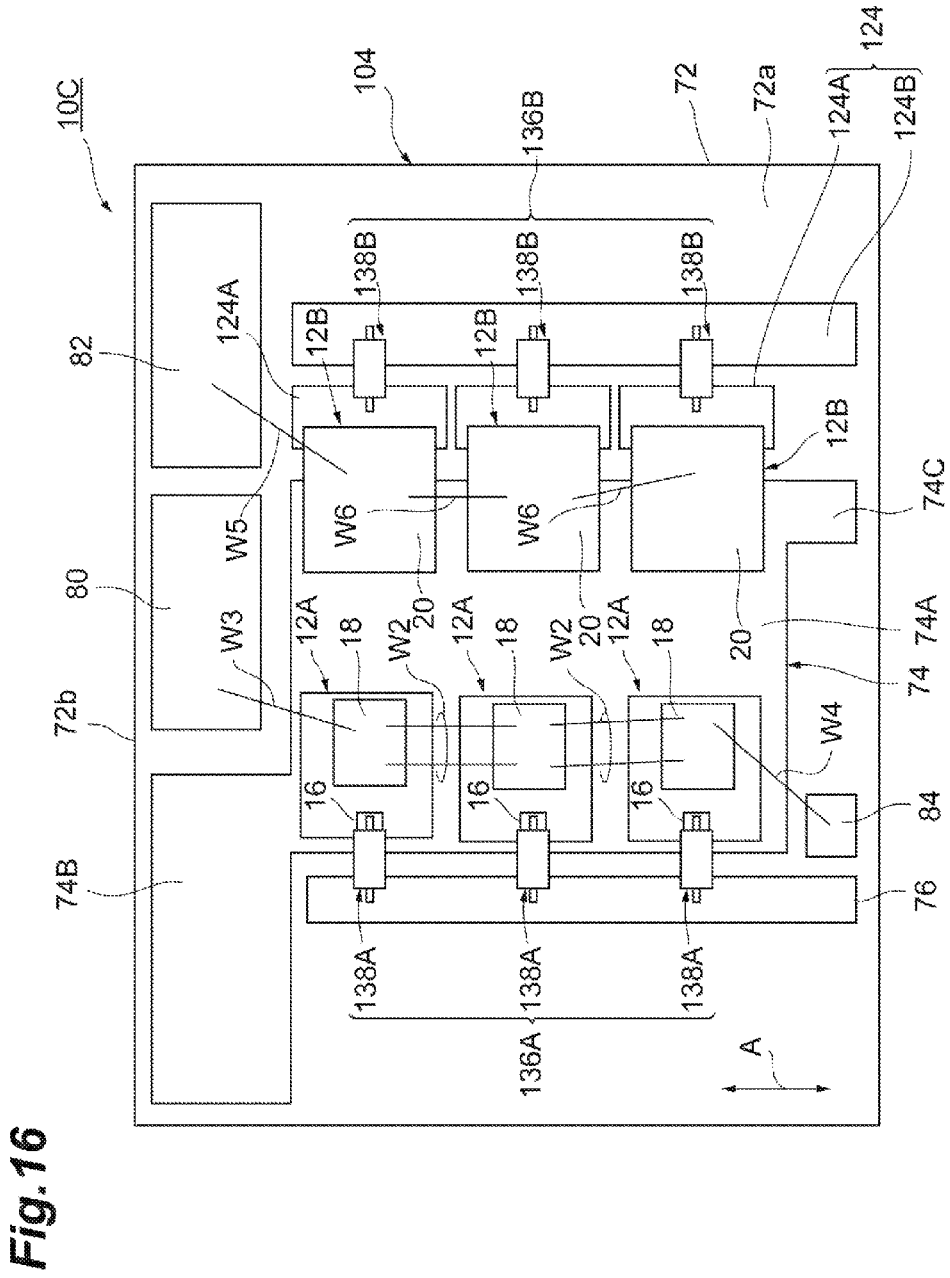
FIG. 16 is a schematic plan view of a semiconductor module according to a third embodiment.

A semiconductor module 10C according to a third embodiment will be described. The semiconductor module 10C is mainly different from the configuration of the semiconductor module 10B in that the semiconductor module 10C includes first transistor chips 12A and second transistor chips 12B instead of the first transistor chips 100A and the second transistor chips 100B, and includes a first resistance part 136A and a second resistance part 136B instead of the first resistance part 102A and the second resistance part 102B, as illustrated in FIG. 16. The semiconductor module 10C will be described mainly on this difference.

Since the first transistor chips 12A and the second transistor chips 12B are similar to the first transistor chips 12A and the second transistor chips 12B in the semiconductor module 10A of the first embodiment, description thereof is omitted.

The first resistance part 136A and the second resistance part 136B respectively have a plurality of first resistance elements 138A and a plurality of second resistance elements 138B each of which is not physically integrated together.

Each of the first and second resistance elements 138A, 138B corresponds to the one in which the body part 116 of each of the plurality of resistance elements 108 in the resistance part 102 illustrated in FIG. 12 is buried in the resin part 110 discretely. Each of the first and second resistance elements 138A, 138B can be manufactured by being molded for each body part 116 after the body part 116 is mounted to the lead frame 119 as illustrated in FIG. 14(a), in the method for manufacturing the resistance part 102 illustrated in FIG. 14(a) to FIG. 14(c).

However, as for the first and second resistance elements 138A, 138B, a resistance element that is usually used as a gate resistance may be used.

In the semiconductor module 10C, a gate electrode pad 16 of each of the plurality of first transistor chips 12A is connected to a second wiring pattern 76 via the corresponding first resistance element 138A. Similarly, each of a plurality of pad connection regions 124A is connected to a gate terminal connection region 124B via the corresponding second resistance element 138B.

In the semiconductor module 10C, similarly to the semiconductor module 10A, the first and second transistor chips 12A, 12B are mounted on the wiring substrate 104 in a state in which the front and back of the first and second transistor chips 12A, 12B are reversed to each other. For that reason, a drain electrode pad 20 of each of the first transistor chips 12A and a source electrode pad 18 of each of the second transistor chips 12B can be connected together via the first chip mounting region 74A. Therefore, the semiconductor module 10C has functional effects that are at least similar to those of the semiconductor module 10A.

In addition, in the semiconductor module 10C, the gate electrode pad 16 of each of the first transistor chips 12A and the second wiring pattern 76 are connected together via the first resistance element 138A. The first resistance element 138A and the gate electrode pad 16 are directly connected together, and the first resistance element 138A and the second wiring pattern 76 are directly connected together.

For that reason, the eleventh wire W11 is not necessary since the resistance connection regions 130A does not have to be provided as illustrated in FIG. 15, for example. Therefore, similarly to the case of the second embodiment, influence of the inductance component of the wire can be reduced by reducing the number of wires in the first transistor chip 12A side. As a result, in the semiconductor module 10C, the fluctuation of the gate potential at a high frequency is suppressed. Thus, high speed operation of the semiconductor module 10C is possible further. Further, since the resistance connection regions 130A are not necessary, the semiconductor module 10C can be downsized.

In the semiconductor module 10C, the gate electrode pad 16 of each of the second transistor chips 12B is directly connected to the pad connection region 124A via solder or the like. For that reason, the twelfth wire W12 is not necessary for connecting the gate electrode pad 16 and the pad connection region 124A together.

Therefore, influence of the inductance component of the wire can be reduced by reducing the number of wires in the second transistor chip 12B side. As a result, in the semiconductor module 10C, the fluctuation of the gate potential at a high frequency is suppressed. As a result, high speed operation of the semiconductor module 10C is possible further.

<4> Fourth Embodiment

Figure 17:
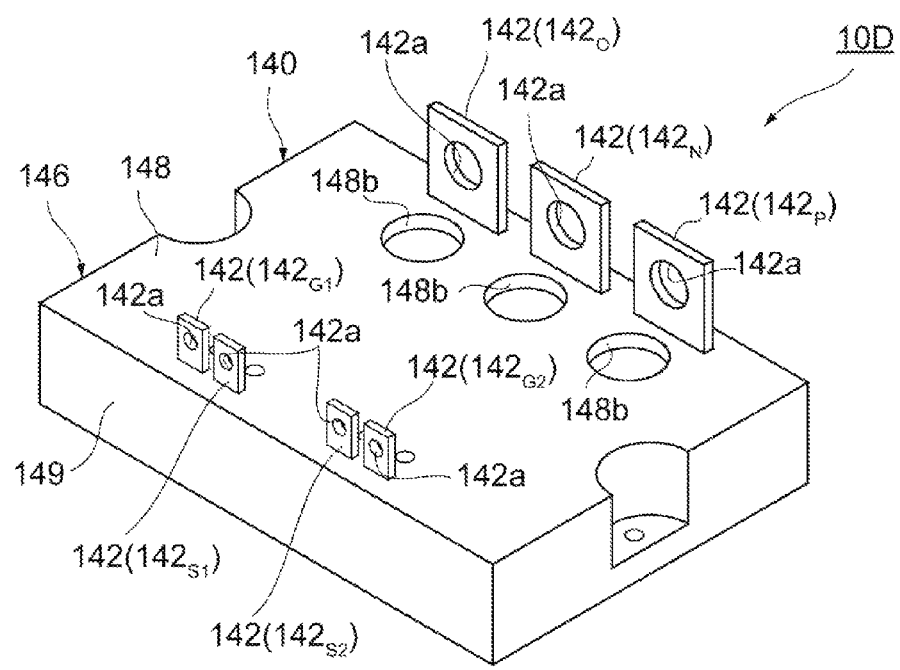
FIG. 17 is a schematic perspective view of a semiconductor module according to a fourth embodiment.
Figure 18:
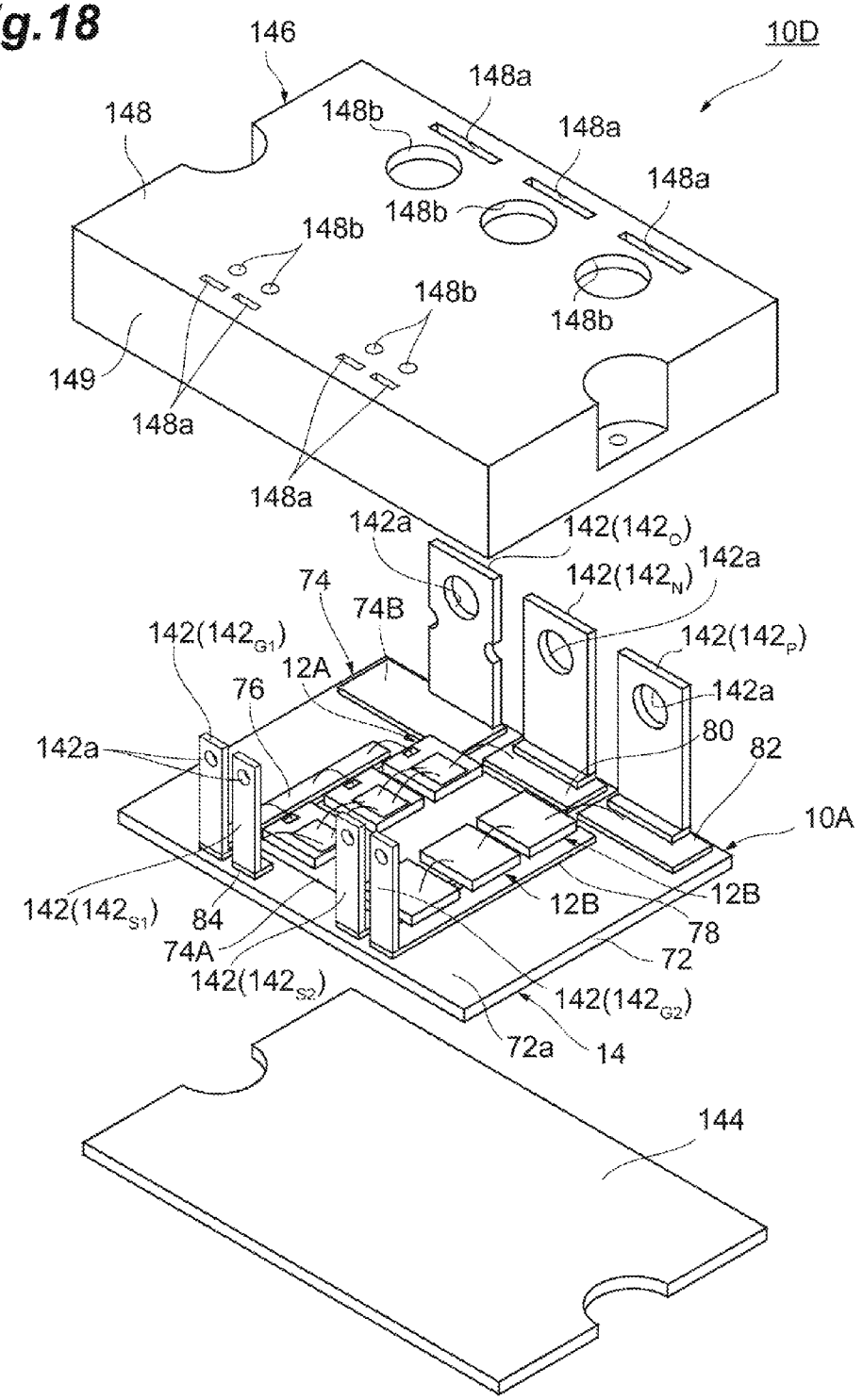
FIG. 18 is a schematic exploded perspective view of the semiconductor module illustrated in FIG. 17.

A semiconductor module 10D according to a fourth embodiment will be described. The semiconductor module 10D may include a semiconductor module 10A according to the first embodiment, a housing 140 for accommodating the semiconductor module 10A, and six bus bars 142 for external connection, as illustrated in FIG. 17 and FIG. 18. When the six bus bars 142 are distinguished from each other and described, the six bus bars 142 are individually referred to as bus bar $142_O$, $142_N$, $142_P$, $142_{G1}$, $142_{S1}$, $142_{S2}$, or $142_{G2}$.

The housing 140 has a bottom plate 144 on which a wiring substrate 14 mounted with a plurality of first and second transistor chips 12A, 12B and the like is placed, and a cover part 146 for covering the wiring substrate 14, as illustrated in FIG. 18. An example of a material of the bottom plate 144 is a metal such as copper. In this case, the bottom plate 144 also functions as a heat sink.

The cover part 146 has a top plate 148, and a side wall 149 standing from the outer edge of the top plate 148 to the bottom plate 144 side, and has a bottomed cylindrical shape. The top plate 148 has insertion holes 148a through which the respective bus bars 142 are inserted.

The bus bar $142_O$ is electrically connected to a first external connection region 74B of a first wiring pattern 74. For example, one end of the bus bar $142_O$ can be connected to the first external connection region 74B via a conductive adhesive such as solder, as illustrated in FIG. 18. Thus, the bus bar $142_O$ functions as an output terminal.

The bus bar $142_N$ is electrically connected to a fourth wiring pattern 80. For example, one end of the bus bar $142_N$ can be connected to the fourth wiring pattern 80 via a conductive adhesive such as solder, as illustrated in FIG. 18. Thus, the bus bar $142_N$ functions as a negative voltage input terminal.

The bus bar $142_P$ is electrically connected to a fifth wiring pattern 82. For example, one end of the bus bar $142_P$ can be connected to the fifth wiring pattern 82 via a conductive adhesive such as solder, as illustrated in FIG. 18. Thus, the bus bar $142_P$ functions as a positive voltage input terminal.

The bus bar $142_{G1}$ is electrically connected to a second wiring pattern 76. For example, one end of the bus bar $142_{G1}$ can be connected to the second wiring pattern 76 via a conductive adhesive such as solder, as illustrated in FIG. 18. Thus, the bus bar $142_{G1}$ functions as an input terminal (first gate terminal) of a gate voltage to each of the first transistor chips 12A.

The bus bar $142_{S1}$ is electrically connected to a sixth wiring pattern 84. For example, one end of the bus bar $142_{S1}$ can be connected to the sixth wiring pattern 84 via a conductive adhesive such as solder, as illustrated in FIG. 18. Thus, the bus bar $142_{S1}$ functions as a source terminal (first source terminal) for each of the first transistor chips 12A.

The bus bar $142_{S2}$ is electrically connected to a second external connection region 74C of the first wiring pattern 74. For example, one end of the bus bar $142_{S2}$ can be connected to the second external connection region 74C via a conductive adhesive such as solder, as illustrated in FIG. 18. Thus, the bus bar $142_{S2}$ functions as a source terminal (second source terminal) for each of the second transistor chips 12B.

The bus bar $142_{G2}$ is electrically connected to a third wiring pattern 78. For example, one end of the bus bar $142_{G2}$ can be connected to the third wiring pattern 78 via a conductive adhesive such as solder, as illustrated in FIG. 18. Thus, the bus bar $142_{G2}$ functions as an input terminal (second gate terminal) of a gate voltage to each of the first transistor chips 12A.

In a region drawn outside the housing 140 in each of the bus bars 142, an insertion hole 142a is formed, through which a fastener such as a bolt is inserted so that a connection terminal to an external device can be fastened thereto.

In FIG. 17, the bus bars 142 extend in the normal direction of the front surface of the top plate 148; however, the bus bars 142 may be bent toward the top plate 148 side when the bus bars 142 are connected to the external device. When the bus bars 142 are connected to the external device, the connection terminal and the like from the external device are fixed by bolts and nuts by using the insertion holes 144a. For that reason, accommodation holes 148b in which bolt heads or nuts are accommodated when the bus bars 142 are bent may be formed in the top plate 148.

The semiconductor module 10D accommodates the semiconductor module 10A in the housing 140. For that reason, the semiconductor module 10D has functional effects similar to those of the semiconductor module 10A. An embodiment in which the semiconductor module 10A is accommodated in the housing 140 has been described as an example; however, the semiconductor modules 10B, 10C may be accommodated instead of the semiconductor module 10A.

In addition, an embodiment has been exemplified in which the bottom plate 144 and the cover part 146 are provided as the housing 140; however, it is sufficient that the housing has a configuration in which the semiconductor module 10A, the semiconductor module 10B, or the semiconductor module 10C can be accommodated, and the bus bars 142 can be drawn outside the housing 140.

Various embodiments according to the present invention have been described above; however, the present invention is not limited to various forms described above, and can be variously modified without departing from the spirit of the invention.

Usually, each of the first and second transistor chips 100A, 100B as a MOSFET, because of its configuration, have a parasitic diode inside the chip, and the parasitic diode can function as a freewheeling diode. For that reason, as the semiconductor module according to the first to third embodiments, an embodiment has been exemplified in which the freewheeling diode is not mounted separately from each of the first and second transistor chips.

However, for example, the semiconductor module may have the freewheeling diode chip separately from each of the first and second transistor chips. An example will be described of a configuration of a semiconductor module having the freewheeling diode, with reference to FIG. 19.

Figure 19:
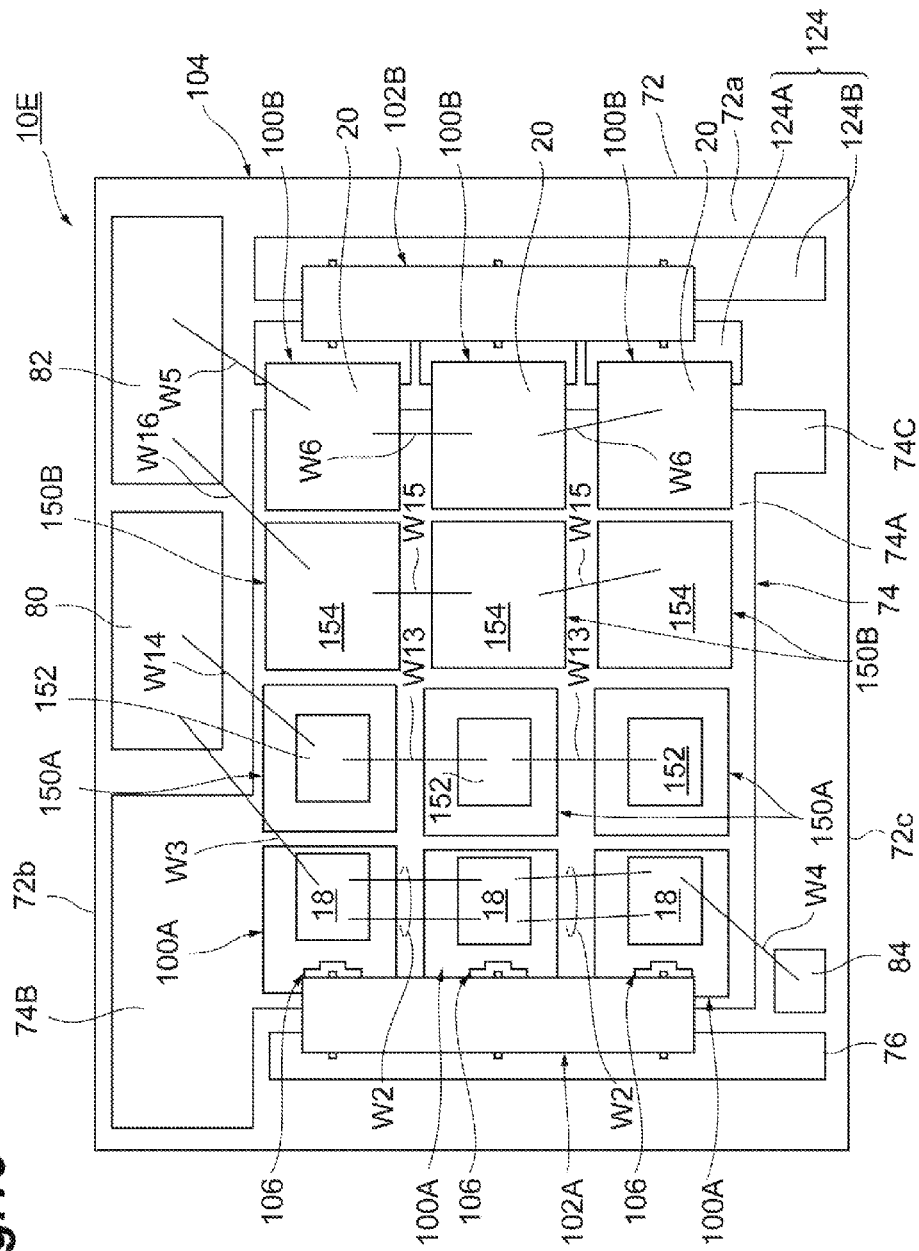
FIG. 19 is a schematic plan view of a semiconductor module according to yet another embodiment.

A semiconductor module 10E illustrated in FIG. 19 has first and second diode chips 150A, 150B as freewheeling diodes, and the configuration of the semiconductor module 10E corresponds to an embodiment in which the semiconductor module 10B according to the second embodiment has the first and second diode chips 150A, 150B. The configurations of the first and second diode chips 150A, 150B are the same as each other, and each of the diode chips is a vertical diode having an anode electrode 152 on the front surface and a cathode electrode 154 on the back surface.

Each of the first diode chips 150A is mounted on the first chip mounting region 74A so that the cathode electrode 154 of each of the first diode chips 150A faces the first chip mounting region 74A, so that the cathode electrode 154 of each of the first diode chips 150A is connected to the first chip mounting region 74A.

The anode electrodes 152 of the adjacent first diode chips 150A are connected together via a thirteenth wire W13, and the anode electrodes 152 of the plurality of first diode chips 150A are connected to the fourth wiring pattern 80 via a fourteenth wire W14.

As for the second diode chips 150B, the anode electrode 152 of each of the second diode chips 150B is mounted on the first chip mounting region 74A, so that the anode electrode 152 of each of the second diode chips 150B is connected to the first chip mounting region 74A.

The cathode electrodes 154 of the adjacent second diode chips 150B are connected together via a fifteenth wire W15, and the cathode electrodes 154 of the plurality of second diode chips 150B are connected to the fifth wiring pattern 82 via a sixteenth wire W16.

The first and second diode chips 150A, 150B are mounted on the wiring substrate 104 in this way, so that conducting wires such as wires can be reduced for connecting the first and second diode chips 150A, 150B to the first and second transistor chips 100A, 100B, respectively. As a result, the inductance component of the conducting wire can be reduced, and high speed operation of the semiconductor module 10B can be secured.

An embodiment in which the semiconductor module 10B according to the second embodiment has the first and second diode chips 150A, 150B has been exemplified; however, the semiconductor module according to other embodiments may have the first and second diode chips 150A, 150B as freewheeling diodes, similarly.

Figure 20:
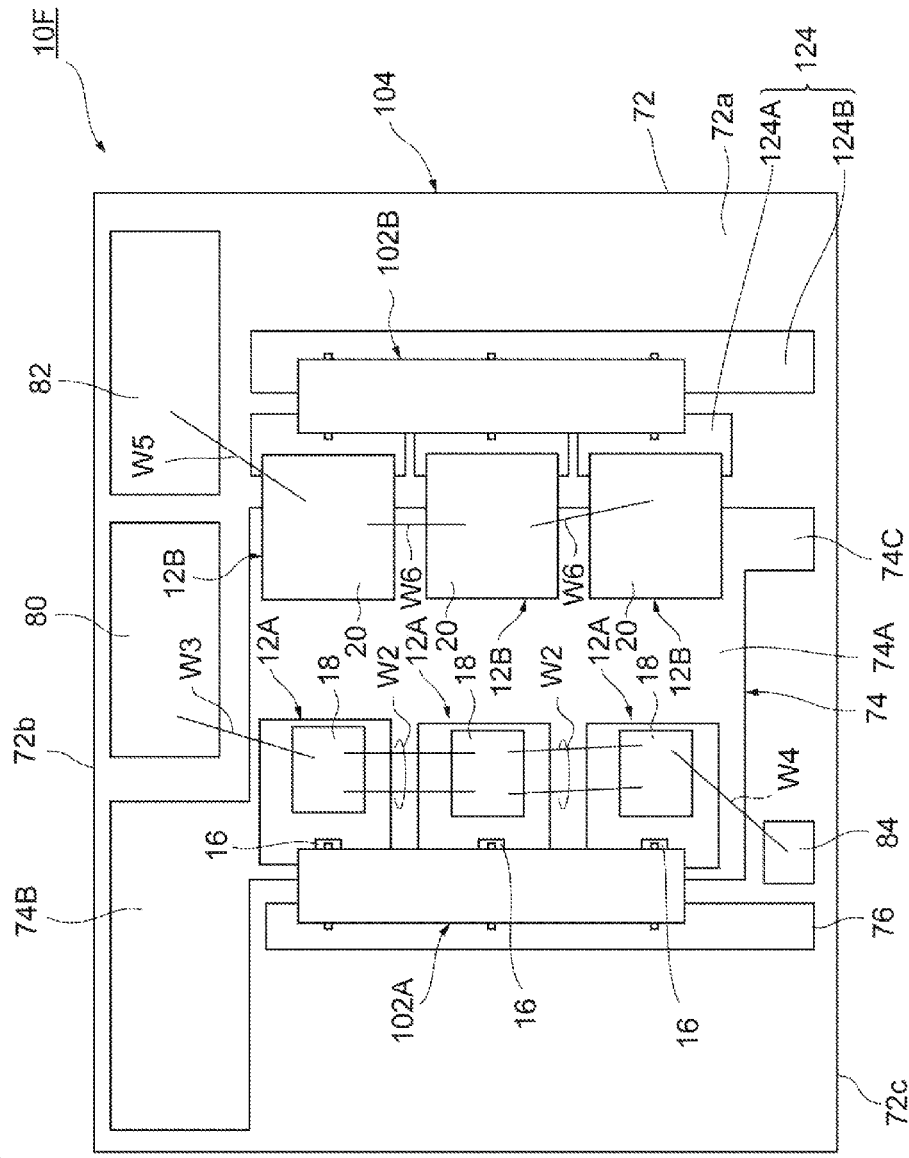
FIG. 20 is a schematic plan view of a semiconductor module according to yet another embodiment.

In addition, in the semiconductor module 10B according to the second embodiment, the first and second transistor chips 12A, 12B may be used instead of the first and second transistor chips 100A, 100B, as in a semiconductor module 10F illustrated in FIG. 20.

Figure 4:
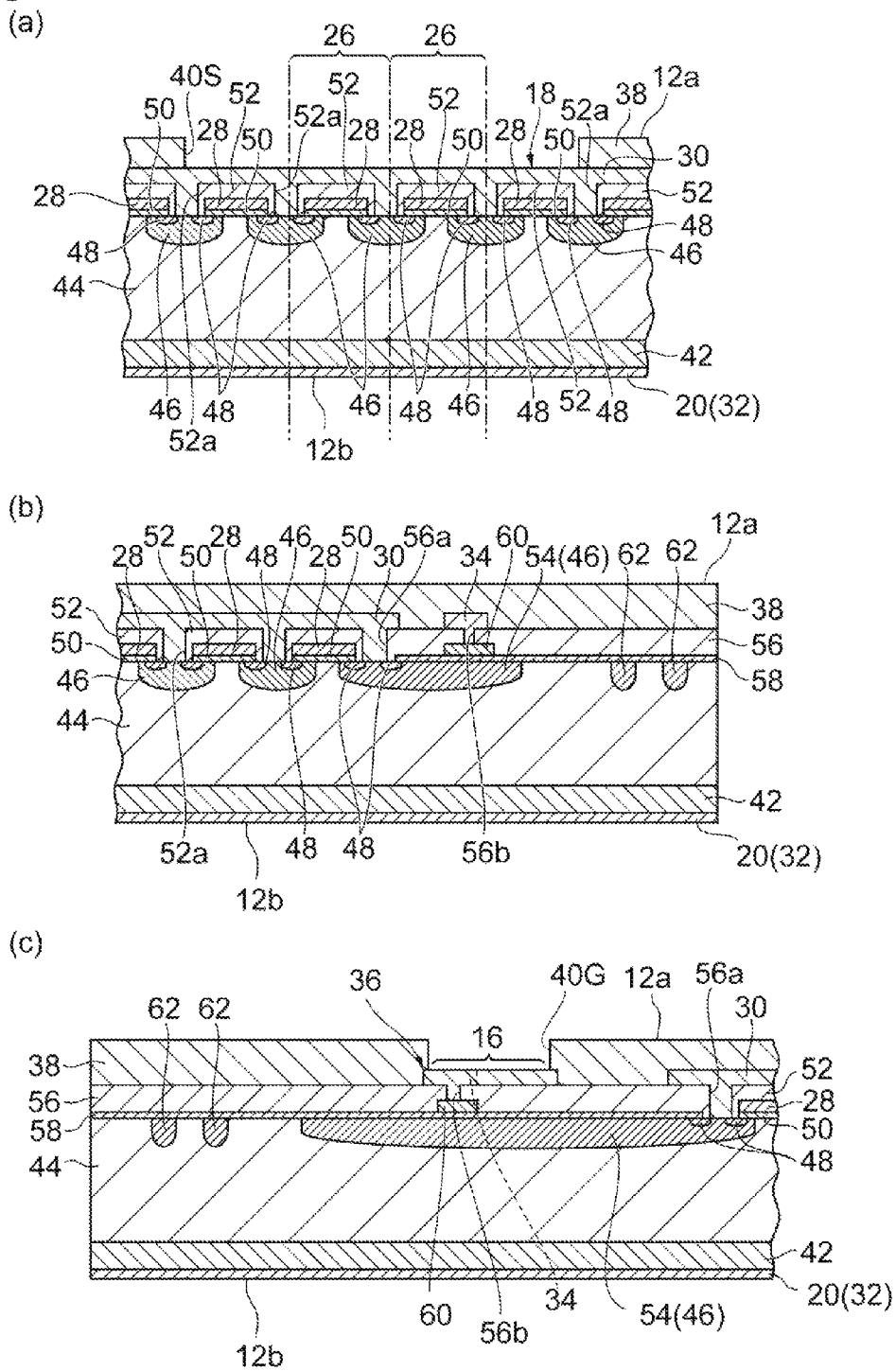
FIG. 4(a) is a schematic view of a cross section along a line IVa-IVa of FIG. 3.
FIG. 4(b) is a schematic view of a cross section along a line IVb-IVb of FIG. 3.
FIG. 4(c) is a schematic view of a cross section along a line IVc-IVc of FIG. 3.

The configurations of the first and second transistor chips are not limited to the configurations illustrated in FIG. 1, FIG. 4, and FIG. 11, and it is sufficient that each of the first transistor chips has a pair of main electrode pads and a control electrode pad, and one main electrode pad (first main electrode pad) of the pair of main electrode pads and the control electrode pad (first control electrode pad) are provided on the front surface, and the other main electrode pad (second main electrode pad) is provided on the back surface. Similarly, it is sufficient that each of the second transistor chips has a pair of main electrode pad and a control electrode pad, and one main electrode pad (third main electrode pad) of the pair of main electrode pads and the control electrode pad (second control electrode pad) are provided on the front surface, and the other main electrode pad (fourth main electrode pad) is provided on the back surface.

The MOSFET has been exemplified as each of the first and second transistor chips; however, each of the first and second transistor chips may be, for example, an insulated gate bipolar transistor (IGBT). In this case, the embodiment having the first and second diode chips 150A, 150B is effective, as illustrated in FIG. 19.

When each of the first transistor chips is the IGBT, it is sufficient that an emitter electrode pad (first main electrode pad) and a gate electrode pad (first control electrode pad) are formed on the front surface, and a collector electrode pad (second main electrode pad) is formed on the back surface. Similarly, when each of the second transistor chips is the IGBT, it is sufficient that an emitter electrode pad (third main electrode pad) and a gate electrode pad (second control electrode pad) are formed on the front surface, and a collector electrode pad (fourth main electrode pad) is formed on the back surface.

In the first to fourth embodiments, the semiconductor module as a single phase inverter has been exemplified. However, the semiconductor module is not limited to the single phase inverter. For example, it may be a three-phase inverter. In this case, it is sufficient that, when the configuration on the front surface 72a of the insulating substrate 72 exemplified in the first to third embodiments is one unit, three units are formed on the front surface 72a, and the wiring corresponding to the three phase inverter is performed by using the conducting wire. Incidentally, the first external connection region 74B may be common.

In addition, for example, in the second embodiment, the first resistance part in which the plurality of first resistance elements is linked together by the linking part may be connected in a planar manner to each of the first transistor chips and the like without going through the lead, for example. Similarly, the second resistance part in which the plurality of second resistance elements is linked together by the linking part may be connected in a planar manner to each of the pad connection region and the like without going through the lead, for example.

In the above description, the wire has been exemplified as the conducting wire used for wiring in the semiconductor module; however, the conducting wire may be a ribbon, for example. Further, it is sufficient that the semiconductor module includes at least one first transistor chip and at least one second transistor chip.

The first to fourth embodiments and modifications described above may be combined within a scope without departing from the spirit of the present invention. For example, in the semiconductor module 10B of the second embodiment, the second transistor chips 12B described in the first embodiment may be used instead of the second transistor chips 100B.

REFERENCE SIGNS LIST

10A, 10B, 10C, 10D, 10E, 10F . . . Semiconductor module, 12A . . . First transistor chip, 12B . . . Second transistor chip, 12a . . . Front surface (surfaces of first and second transistor chips), 12b . . . Back surface (front surfaces of first and second transistor chips), 16 . . . Gate electrode pad (first and second control electrode pads), 18 . . . Source electrode pad (first and third main electrode pads), 20 . . . Drain electrode pad (second and fourth main electrode pads), 22 . . . Cell portion, 24 . . . Circumferential portion, 28 . . . Gate electrode (control electrode), 30 . . . Source electrode (first main electrode), 32 . . . Drain electrode (second main electrode), 34 . . . Gate electrode wiring (control electrode wiring), 72 . . . Insulating substrate (substrate), 72a . . . Front surface (principal surface), 74 . . . First wiring pattern, 76 . . . Second wiring pattern, 78 . . . Third wiring pattern, 100A . . . First transistor chip, 100B . . . Second transistor chip, 100a . . . Front surface (surfaces of first and second transistor chips), 100b . . . Back surface (back surfaces of first and second transistor chips), 102A . . . First resistance part, 102B . . . Second resistance part, 106 . . . Gate electrode pad (first and second control electrode pads), 108A . . . First resistance element, 108B . . . Second resistance element, 110A . . . First resin part (first linking part), 110B . . . Second resin part (second linking part), 138A . . . First resistance element, 138B . . . Second resistance element, W2, W6 . . . Conducting wire

The invention claimed is:

1. A semiconductor module comprising:
    a substrate on which a first wiring pattern, a second wiring pattern, and a third wiring pattern are formed on a principal surface;
    a vertical first transistor chip mounted on the substrate; and
    a vertical second transistor chip mounted on the substrate, wherein
    the first transistor chip has
        a first main electrode pad and a second main electrode pad, and
        a first control electrode pad to which a control voltage is supplied for controlling conduction between the first main electrode pad and the second main electrode pad,
    the first main electrode pad and the first control electrode pad are formed on a front surface of the first transistor chip,
    the second main electrode pad is formed on a back surface of the first transistor chip,
    the second transistor chip has
        a third main electrode pad and a fourth main electrode pad, and
        a second control electrode pad to which a control voltage is supplied for controlling conduction between the third main electrode pad and the fourth main electrode pad, the third main electrode pad and the second control electrode pad are formed on a front surface of the second transistor chip, the fourth main electrode pad is formed on a back surface of the second transistor chip, the first transistor chip is mounted on the first wiring pattern such that the back surface of the first transistor chip faces the principal surface of the substrate, thereby connecting the second main electrode pad to the first wiring pattern, the first control electrode pad is electrically connected to the second wiring pattern, the second transistor chip is mounted on the first wiring pattern such that the front surface of the second transistor chip faces the principal surface of the substrate, thereby connecting the third main electrode pad to the first wiring pattern, and the second control electrode pad of the second transistor chip is electrically connected to the third wiring pattern.

2. A semiconductor module comprising:

a substrate on which a first wiring pattern, a second wiring pattern, and a third wiring pattern are formed on a principal surface;

vertical first transistor chips mounted on the substrate; and vertical second transistor chips mounted on the substrate, wherein each of the first transistor chips has
  a first front surface,
  a first back surface,
  a first main electrode pad formed on the first front surface,
  a second main electrode pad formed on the first back surface, and
  a first control electrode pad formed on the first front surface and to which a control voltage is supplied for controlling conduction between the first main electrode pad and the second main electrode pad, and each of the second transistor chips has
  a second front surface,
  a second back surface,
  a third main electrode pad formed on the second front surface,
  a fourth main electrode pad formed on the second back surface, and
  a second control electrode pad formed on the second front surface and to which a control voltage is supplied for controlling conduction between the third main electrode pad and the fourth main electrode pad, each of the first transistor chips is mounted on the first wiring pattern such that the first back surface faces the principal surface of the substrate, thereby connecting the second main electrode pad to the first wiring pattern, the first control electrode pad of each of the first transistor chips is electrically connected to the second wiring pattern, each of the second transistor chips is mounted on the first wiring pattern such that the second front surface faces the principal surface of the substrate, thereby connecting the third main electrode pad to the first wiring pattern, and the second control electrode pad of each of the second transistor chips is electrically connected to the third wiring pattern, each one of the first transistor chips and the second transistor chips includes a wide band gap semiconductor, the first main electrode pad of each of the first transistor chips is connected to each other via a conducting wire, and the fourth main electrode pad of each of the second transistor chips is connected to each other via a conducting wire.

3. The semiconductor module according to claim 2, wherein the second control electrode pad of each of the second transistor chips is connected to the third wiring pattern by being mounted on the third wiring pattern.

4. The semiconductor module according to claim 2, wherein the third wiring pattern has:
  chip corresponding regions that respectively corresponds to the second transistor chips and are insulated from each other; and
  an external connection region insulated from each of the chip corresponding regions, the second control electrode pad of each of the second transistor chips is mounted on one of the chip corresponding regions, thereby being connected to the one of the chip corresponding regions, the chip corresponding regions are connected to the external connection region via a second resistance part, and the second resistance part has
  second resistance elements respectively corresponding to the chip corresponding regions and connected to the chip corresponding regions, and
  a second linking part linking the second resistance elements together.

5. The semiconductor module according to claim 2, wherein the first control electrode pad of each of the first transistor chips is connected to the second wiring pattern via a first resistance part, and the first resistance part has
  first resistance elements each of which corresponds to one of the first transistor chips and is connected to the first control electrode pad, and
  a linking part linking the first resistance elements together.

6. The semiconductor module according to claim 5, wherein the second control electrode pad of each of the second transistor chips is connected to the third wiring pattern by being mounted on the third wiring pattern.

7. The semiconductor module according to claim 5, wherein the first control electrode pad and a corresponding first resistance element of the first resistance elements are physically connected together, and each of the first resistance elements and the second wiring pattern are physically connected together.

8. The semiconductor module according to claim 7, wherein the second control electrode pad of each of the second transistor chips is connected to the third wiring pattern by being mounted on the third wiring pattern.

9. The semiconductor module according to claim 5, wherein
- the first control electrode pad of each of the first transistor chips is connected to the second wiring pattern via a corresponding first resistance element of the first resistance elements,
- the first control electrode pad and the corresponding first resistance element are physically connected together, and
- each of the first resistance elements and the second wiring pattern are physically connected together.

10. The semiconductor module according to claim 9, wherein
- the second control electrode pad of each of the second transistor chips is connected to the third wiring pattern by being mounted on the third wiring pattern.

11. The semiconductor module according to claim 5, wherein
- the first transistor chips are arranged in a predetermined direction on the first wiring pattern, and
- the first control electrode pad of each of the first transistor chips extends in the predetermined direction.

12. The semiconductor module according to claim 11, wherein
- the second control electrode pad of each of the second transistor chips is connected to the third wiring pattern by being mounted on the third wiring pattern.

13. The semiconductor module according to claim 11, wherein
- each of the first transistor chips has:
  - a cell portion being a region that has a vertical transistor structure including a first main electrode and a second main electrode electrically connected respectively to the first main electrode pad and the second main electrode pad, and a control electrode electrically connected to the first control electrode pad, and in which a current flows in a conduction state between the first main electrode pad and the second main electrode pad; and
  - a circumferential portion surrounding the cell portion and electrically protecting the cell portion, and
- at least a part of the first control electrode pad is provided on the circumferential portion.

14. The semiconductor module according to claim 13, wherein
- the second control electrode pad of each of the second transistor chips is connected to the third wiring pattern by being mounted on the third wiring pattern.

* * * * *